United States Patent
Sugahara et al.

(10) Patent No.: US 11,861,226 B2
(45) Date of Patent: Jan. 2, 2024

(54) SEMICONDUCTOR MEMORY DEVICE

(71) Applicant: Kioxia Corporation, Tokyo (JP)

(72) Inventors: Akio Sugahara, Yokohama (JP); Zhao Lu, Ebina (JP); Takehisa Kurosawa, Yokohama (JP); Yuji Nagai, Sagamihara (JP)

(73) Assignee: Kioxia Corporation, Tokyo (JP)

( * ) Notice: Subject to any disclaimer, the term of this patent is extended or adjusted under 35 U.S.C. 154(b) by 183 days.

(21) Appl. No.: 17/464,791

(22) Filed: Sep. 2, 2021

(65) Prior Publication Data
US 2022/0317932 A1 Oct. 6, 2022

(30) Foreign Application Priority Data

Mar. 30, 2021 (JP) .................. 2021-057290

(51) Int. Cl.
*G11C 7/00* (2006.01)
*G06F 3/06* (2006.01)
*G11C 16/04* (2006.01)
*G11C 16/26* (2006.01)

(52) U.S. Cl.
CPC .......... *G06F 3/0659* (2013.01); *G06F 3/0604* (2013.01); *G06F 3/0679* (2013.01); *G11C 16/0483* (2013.01); *G11C 16/26* (2013.01)

(58) Field of Classification Search
CPC ....... G11C 7/22; G11C 7/1072; G11C 7/1006; G11C 7/1066
USPC ................. 365/189.05, 206, 189.12
See application file for complete search history.

(56) References Cited

U.S. PATENT DOCUMENTS

| | | | |
|---|---|---|---|
| 8,072,819 B2 | 12/2011 | Rai et al. | |
| 10,120,584 B2 | 11/2018 | Shirakawa et al. | |
| 10,620,881 B2 | 4/2020 | Matulik et al. | |
| 2015/0262630 A1 | 9/2015 | Shirakawa et al. | |
| 2017/0130950 A1* | 5/2017 | Olsson | F21V 31/005 |
| 2018/0024763 A1* | 1/2018 | Kodera | G11C 7/24 |
| | | | 711/163 |
| 2019/0354292 A1 | 11/2019 | O et al. | |
| 2022/0011974 A1 | 1/2022 | Lee et al. | |

FOREIGN PATENT DOCUMENTS

| | | |
|---|---|---|
| JP | 4646932 B2 | 3/2011 |
| JP | 2015-176309 A | 10/2015 |
| TW | 201535252 A | 9/2015 |

\* cited by examiner

*Primary Examiner* — Son T Dinh
(74) *Attorney, Agent, or Firm* — Oblon, McClelland, Maier & Neustadt, L.L.P.

(57) ABSTRACT

A semiconductor memory device comprises: a first pad receiving a first signal; a second pad receiving a second signal; a first memory cell array; a first sense amplifier connected to the first memory cell array; a first data register connected to the first sense amplifier and configured to store user data read from the first memory cell array; and a control circuit configured to execute an operation targeting the first memory cell array. The first memory cell array comprises a plurality of first memory strings. The first memory strings each comprise a plurality of first memory cell transistors. In a first mode of this semiconductor memory device, a command set instructing the operation is inputted via the first pad. In a second mode of this semiconductor memory device, the command set is inputted via the second pad.

19 Claims, 29 Drawing Sheets

FIG. 8
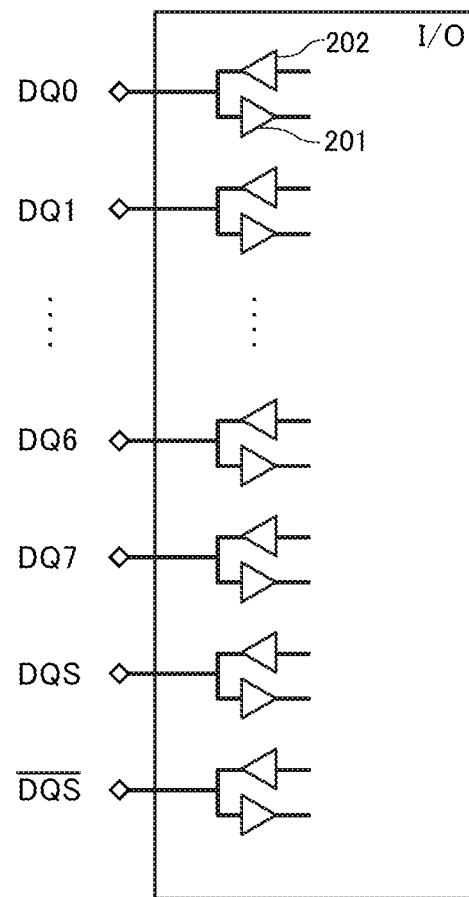
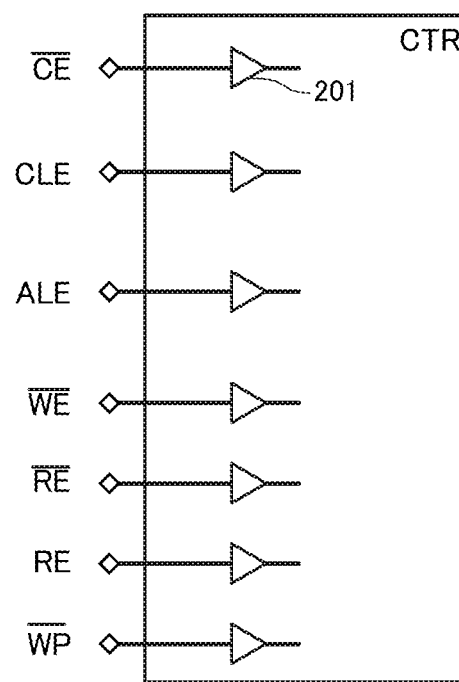

FIG. 11

| MODEa | CLE | ALE | CE | WE | RE | DQS | DQ |
|---|---|---|---|---|---|---|---|
| Cmd/Add | H/L | L/H | L | ⎍ | H | Z | Input |
| DataInput | L | L | L | H | H | output ⎍ | Input |
| DataOutput | L | L | L | H | ⎍ | output ⎍ | Output |
| StatusOutput | L | L | L | H | ⎍ | ⎍ | Output |
| Standby | Z | Z | H | Z | Z | Z | Z |
| Bus Idle | L | L | L | H | X | X | Z |

FIG. 12

| MODEb @ MSel | CLE | ALE | CE | WE | RE | DQS | DQ |
|---|---|---|---|---|---|---|---|
| Cmd | H | L | L | ⎍ | | | |
| Add | L | H | L | ⎍ | | | |

FIG. 13

| MODEb @ S_In | CLE | ALE | CE | WE | RE | DQS | DQ |
|---|---|---|---|---|---|---|---|
| Cmd/Add | input | input | L | ⎍ | | | |
| DataInput | | | L | | H | ⎍ | Input |
| DataOutput | | | L | | ⎍ | output ⎍ | Output |
| StatusOutput | | | L | | ⎍ | output ⎍ | Output |
| Standby | Z | Z | H | Z | Z | Z | Z |
| Bus Idle | L | L | L | H | X | X | Z |

FIG. 25
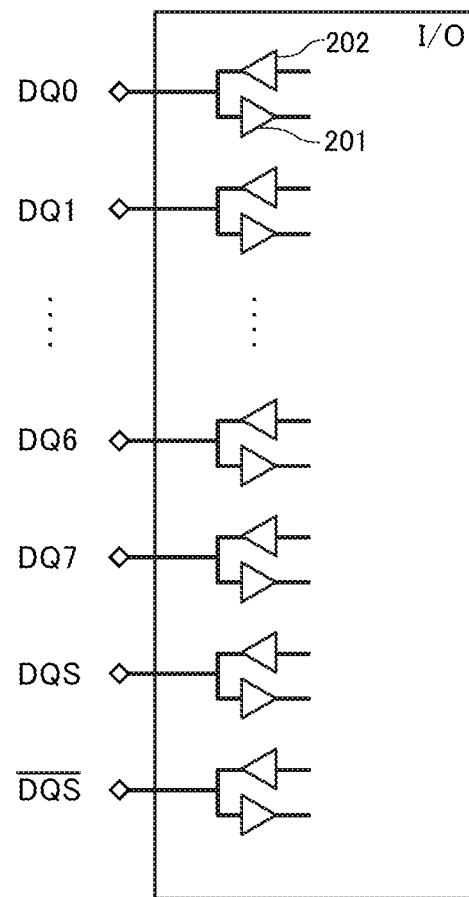
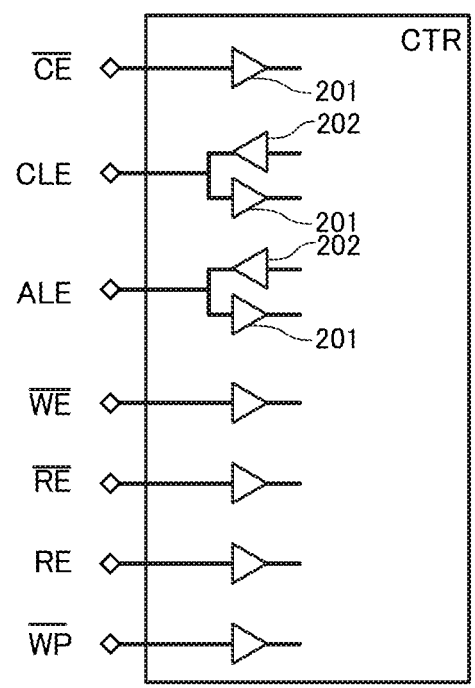

| MODEc @ MSel | CLE | ALE | CE̅ | W̅E̅ | R̅E̅ | DQS | DQ |
|---|---|---|---|---|---|---|---|
| Cmd | H | L | L | ⊓⌐ | | | |
| Add | L | H | L | ⊓⌐ | | | |
| DataOut(Status) | L | L | L | ⊓⌐ | | | |

| MODEc @ S_In, Out | CLE | ALE | CE̅ | W̅E̅ | R̅E̅ | DQS | DQ |
|---|---|---|---|---|---|---|---|
| Cmd/Add | input | input | L | ⊓⌐ | | | |
| DataInput | | | L | | H | ⊓⌐ | Input |
| DataOutput | | | L | | ⊓⌐ | output ⊓⌐ | Output |
| StatusOutput | Output | Output | L | ⊓⌐ | | | |
| Standby | Z | Z | H | Z | Z | Z | Z |
| Bus Idle | L | L | L | H | X | X | Z |

| MODEd @ MSel | CLE | ALE | CE | WE | RE | DQS | DQ |
|---|---|---|---|---|---|---|---|
| Cmd | H | L | L | ⎍ | | | |
| Add | L | H | L | ⎍ | | | |
| DataOut(Status) | L | L | L | ⎍ | | | |
| DQ LUN1 | H | H | L | ⎍ | H | X | X |
| DQ LUN2 | X | X | ⎍ | H | H | X | X |

SEMICONDUCTOR MEMORY DEVICE

CROSS-REFERENCE TO RELATED APPLICATIONS

This application is based upon and claims the benefit of Japanese Patent Application No. 2021-057290, filed on Mar. 30, 2021, the entire contents of which are incorporated herein by reference.

BACKGROUND

Field

Embodiments relate to a semiconductor memory device.

Description of the Related Art

There is known a semiconductor memory device that comprises: a memory cell array including a plurality of memory cells; and a peripheral circuit connected to this memory cell array and outputs user data in response to acceptance of a command set that includes command data and address data.

BRIEF DESCRIPTION OF THE DRAWINGS

FIG. 8 is a schematic circuit diagram showing a configuration of part of the memory die MD.

FIG. 11 is a truth table for explaining operating mode MODEa.

FIG. 12 is a truth table for explaining operating mode MODEb.

FIG. 13 is a truth table for explaining operating mode MODEb.

FIG. 25 is a schematic circuit diagram showing a configuration of part of the memory die MD2.

DETAILED DESCRIPTION

A semiconductor memory device according to an embodiment comprises: a first pad configured to receive a first signal; a second pad configured to receive a second signal; a first memory cell array; a first sense amplifier connected to the first memory cell array; a first data register connected to the first sense amplifier and configured to store data read from the first memory cell array; and a control circuit configured to execute an operation targeting the first memory cell array. The first memory cell array comprises a plurality of first memory strings. The first memory strings each comprise a plurality of first memory cell transistors. Moreover, in a first mode of this semiconductor memory device, a command set instructing the operation is inputted via the first pad. Moreover, in a second mode of this semiconductor memory device, the command set is inputted via the second pad.

Next, semiconductor memory devices according to embodiments will be described in detail with reference to the drawings. Note that the following embodiments are merely examples, and are not shown with the intention of limiting the present invention.

Moreover, when a "semiconductor memory device" is referred to in the present specification, it will sometimes mean a memory die (a memory chip), and will sometimes mean a memory system including a controller die, of the likes of a memory card or an SSD. Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, even when, in the case of three transistors having been serially connected, the second transistor is in an OFF state, the first transistor is still "electrically connected" to the third transistor.

Moreover, in the present specification, when a first configuration is said to be "connected between" a second configuration and a third configuration, it will sometimes mean that the first configuration, the second configuration, and the third configuration are serially connected, and the second configuration is connected to the third configuration via the first configuration.

Moreover, in the present specification, when a circuit, or the like, is said to "make electrically continuous" two wirings, or the like, this will sometimes mean, for example, that this circuit, or the like, includes a transistor, or the like, that this transistor, or the like, is provided in a current path between the two wirings, and that this transistor, or the like, is in an ON state.

First Embodiment

[Memory System 10]

Figure 1:
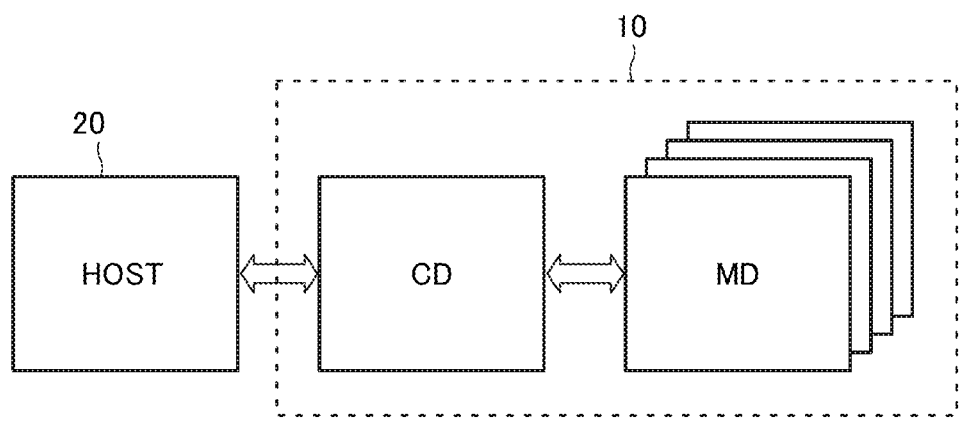
FIG. 1 is a schematic block diagram showing a configuration of a memory system 10 according to a first embodiment.

FIG. 1 is a schematic block diagram showing a configuration of a memory system 10 according to a first embodiment.

The memory system 10 performs read, write, erase, and so on, of user data, according to a signal transmitted from a host computer 20. The memory system 10 is a memory card, an SSD, or another system configured to store user data, for example. The memory system 10 comprises: a plurality of memory dies MD storing user data; and a controller die CD connected to these plurality of memory dies MD and to the host computer 20. The controller die CD comprises the likes of a processor and a RAM, for example, and performs processing, such as conversion of a logical address and a physical address, bit error detection/correction, garbage collection (compaction), and wear leveling.

Figure 2:
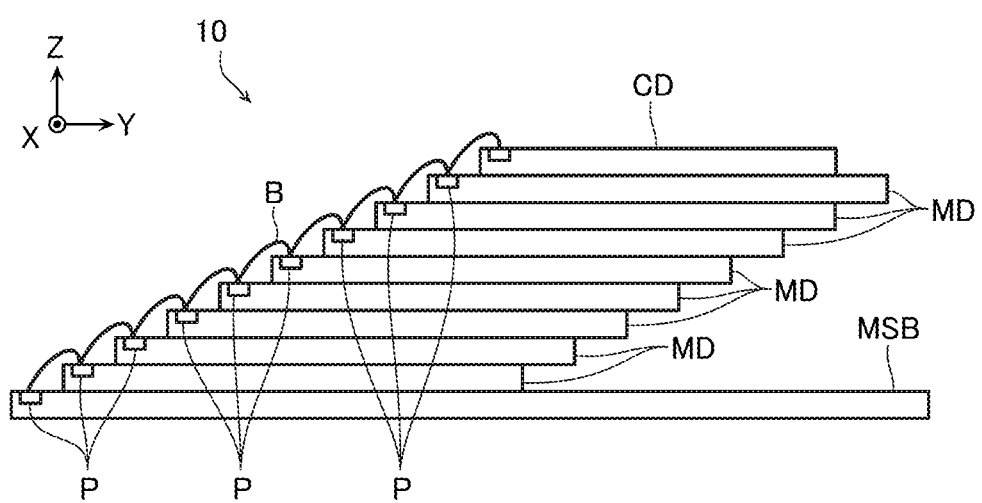
FIG. 2 is a schematic side view showing a configuration example of the memory system 10.
Figure 3:
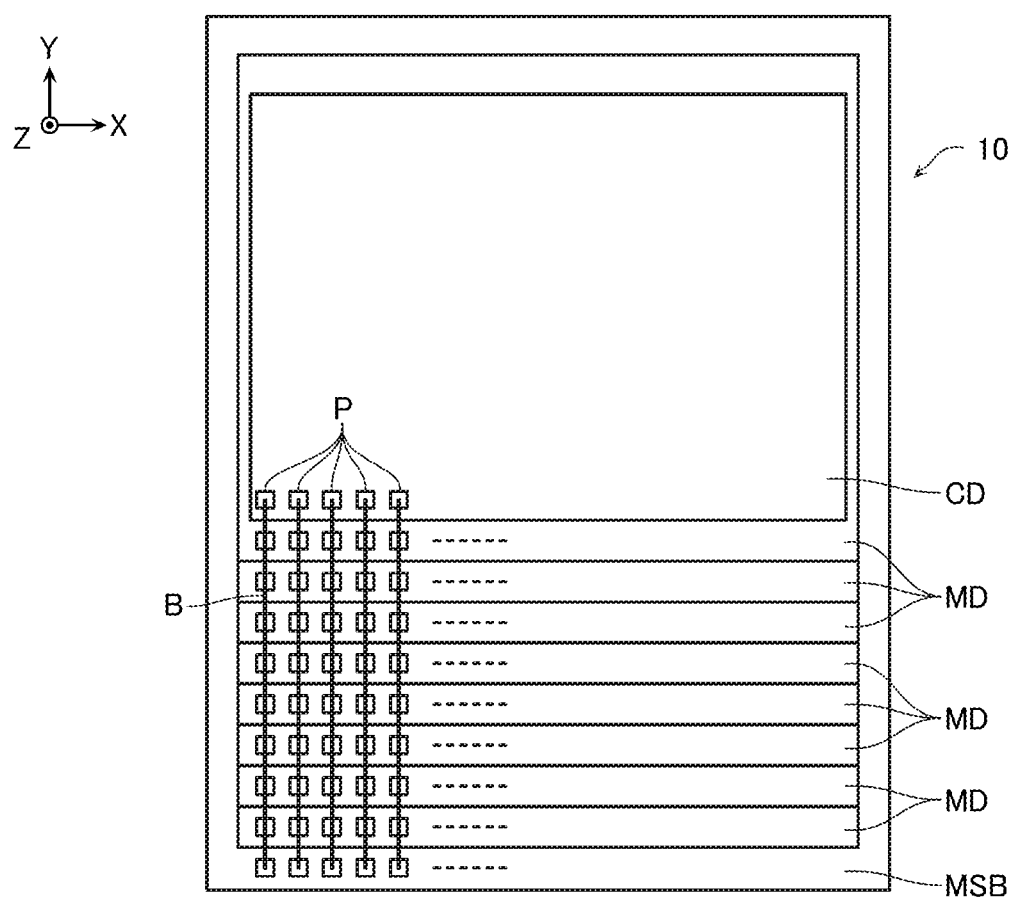
FIG. 3 is a schematic plan view showing a configuration example of the memory system 10.

FIG. 2 is a schematic side view showing a configuration example of the memory system 10 according to the present embodiment. FIG. 3 is a schematic plan view showing same configuration example. For convenience of description, some configurations are omitted in FIGS. 2 and 3.

As shown in FIG. 2, the memory system 10 according to the present embodiment comprises: a mounting substrate MSB; a plurality of the memory dies MD stacked on the mounting substrate MSB; and the controller die CD stacked on the memory dies MD. A region of an end portion in a Y direction, of an upper surface of the mounting substrate MSB is provided with a pad electrode P, and some of another region of the upper surface of the mounting substrate MSB is adhered to a lower surface of the memory die MD, via an adhesive agent, or the like. A region of an end portion in the Y direction, of an upper surface of the memory die MD is provided with the pad electrode P, and another region of the upper surface of the memory die MD is adhered to a lower surface of another memory die MD or of the controller die CD, via an adhesive agent, or the like. A region of an end portion in the Y direction, of an upper surface of the controller die CD is provided with the pad electrode P.

As shown in FIG. 3, the mounting substrate MSB, the plurality of memory dies MD, and the controller die CD each comprise a plurality of the pad electrodes P aligned in an X direction. Pluralities of the pad electrodes P provided to the mounting substrate MSB, the plurality of memory dies MD, and the controller die CD are respectively connected to each other via bonding wires B.

Note that the configuration shown in FIGS. 2 and 3 is merely an exemplification, and that a specific configuration is appropriately adjustable. For example, in the example shown in FIGS. 2 and 3, the controller die CD is stacked on the plurality of memory dies MD, and these configurations are connected by the bonding wires B. In such a configuration, the plurality of memory dies MD and the controller die CD are included in a single package. However, the controller die CD may be included in a separate package from the memory dies MD. Moreover, the plurality of memory dies MD and the controller die CD may be connected to each other via through-electrodes, or the like, not the bonding wires B.

[Configuration of Memory Die MD]

Figure 4:
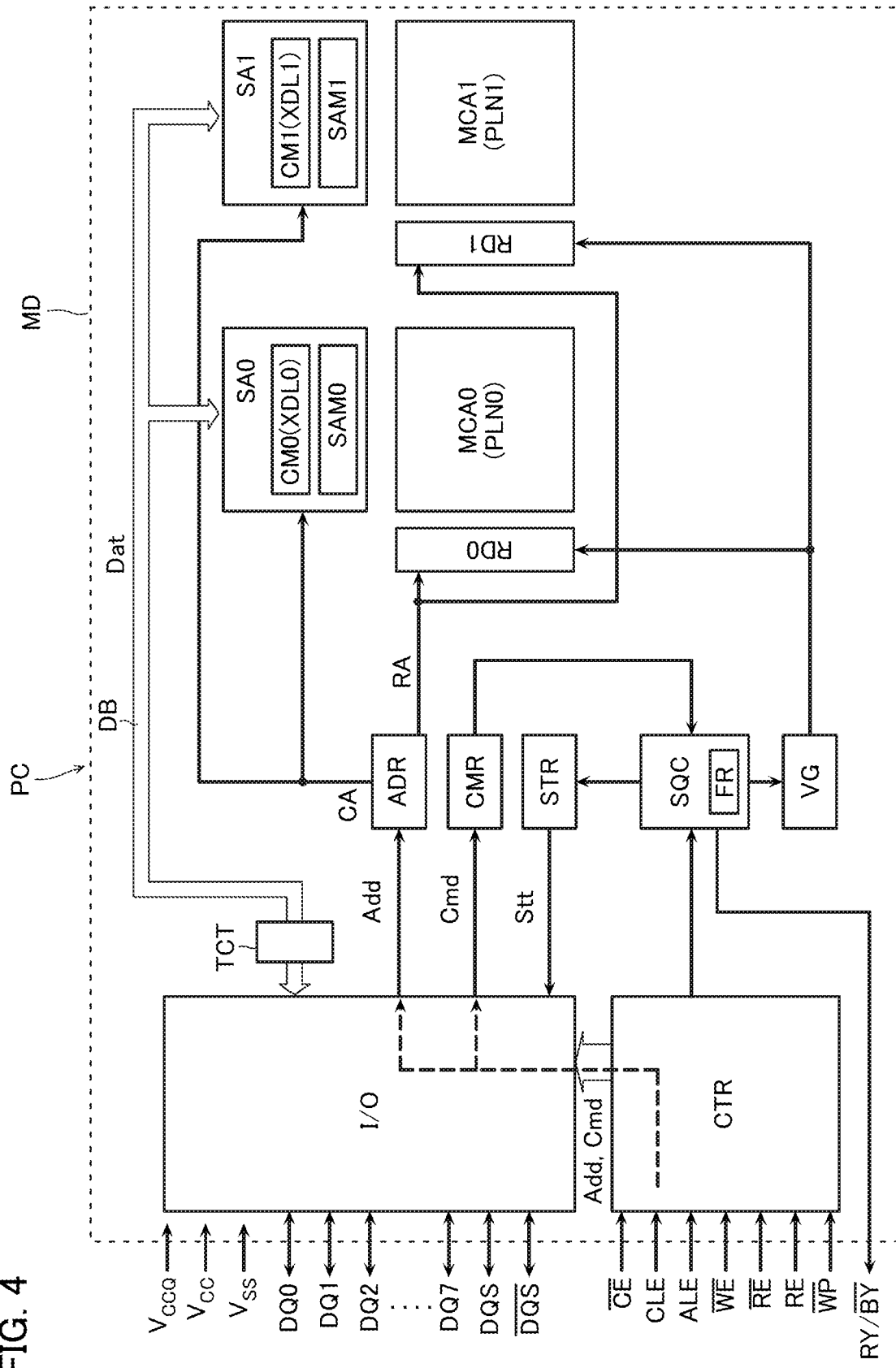
FIG. 4 is a schematic block diagram showing a configuration of a memory die MD.
Figure 5:
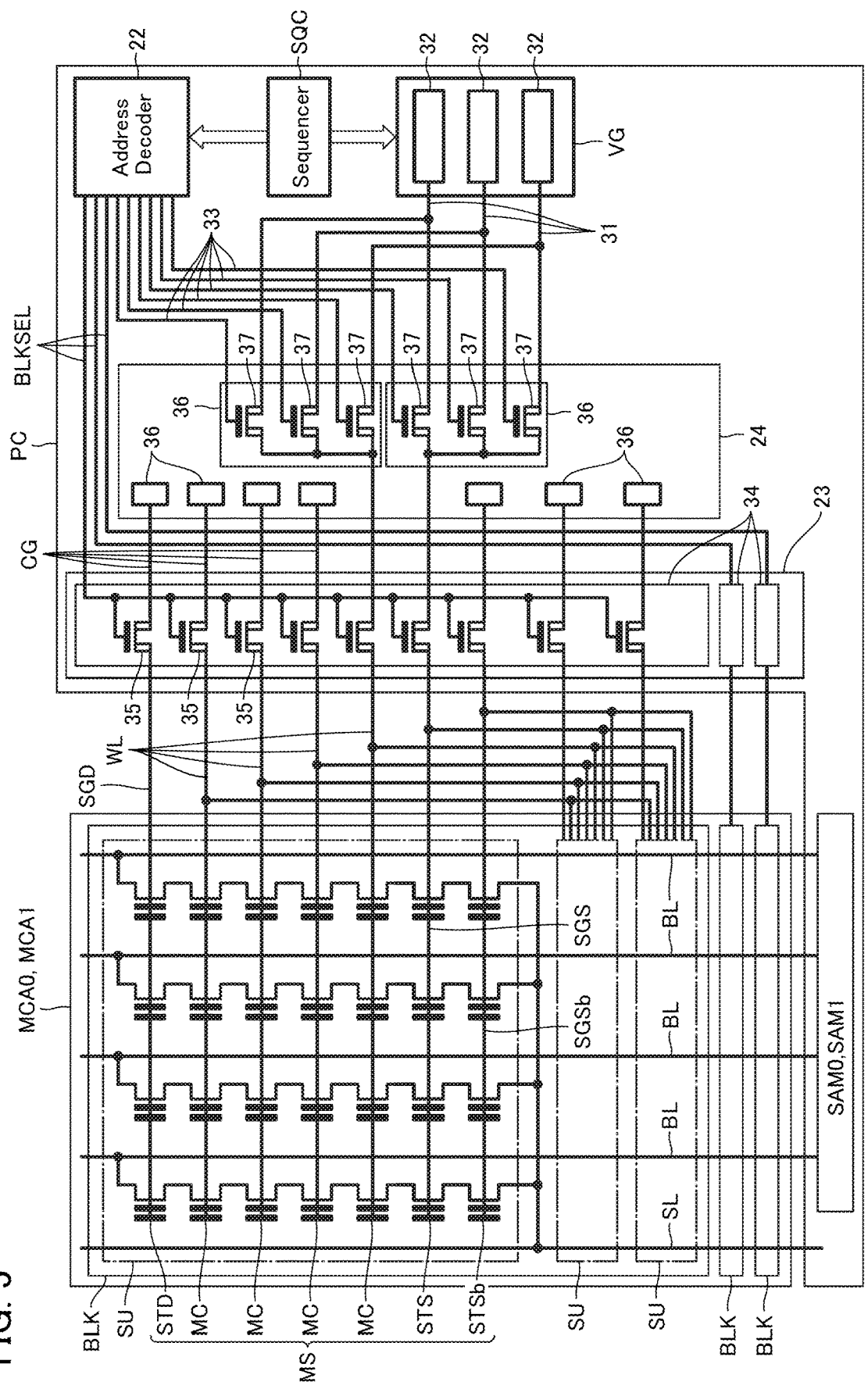
FIG. 5 is a schematic circuit diagram showing a configuration of part of the memory die MD.
Figure 6:
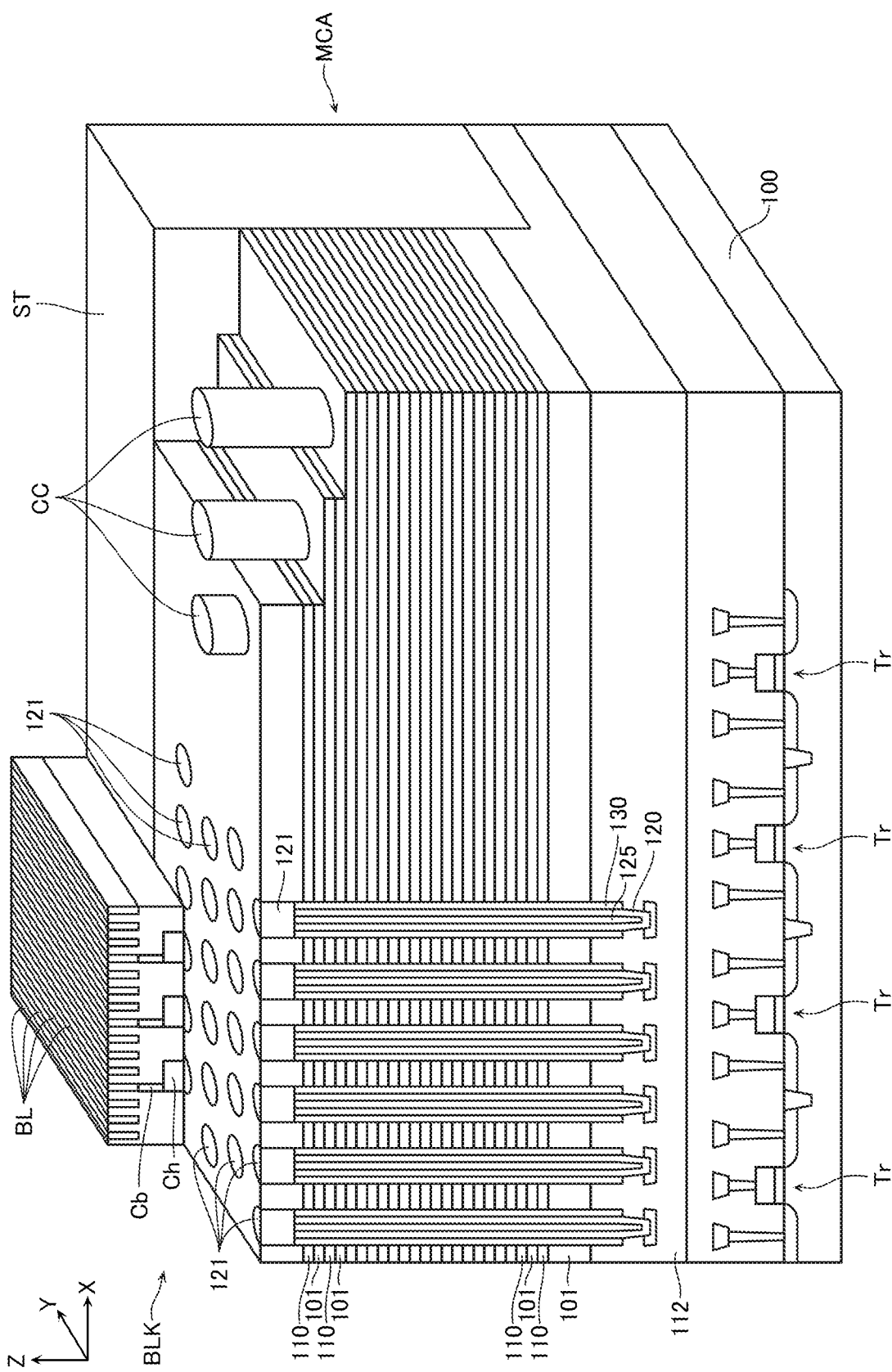
FIG. 6 is a schematic perspective view showing a configuration of part of the memory die MD.
Figure 7:
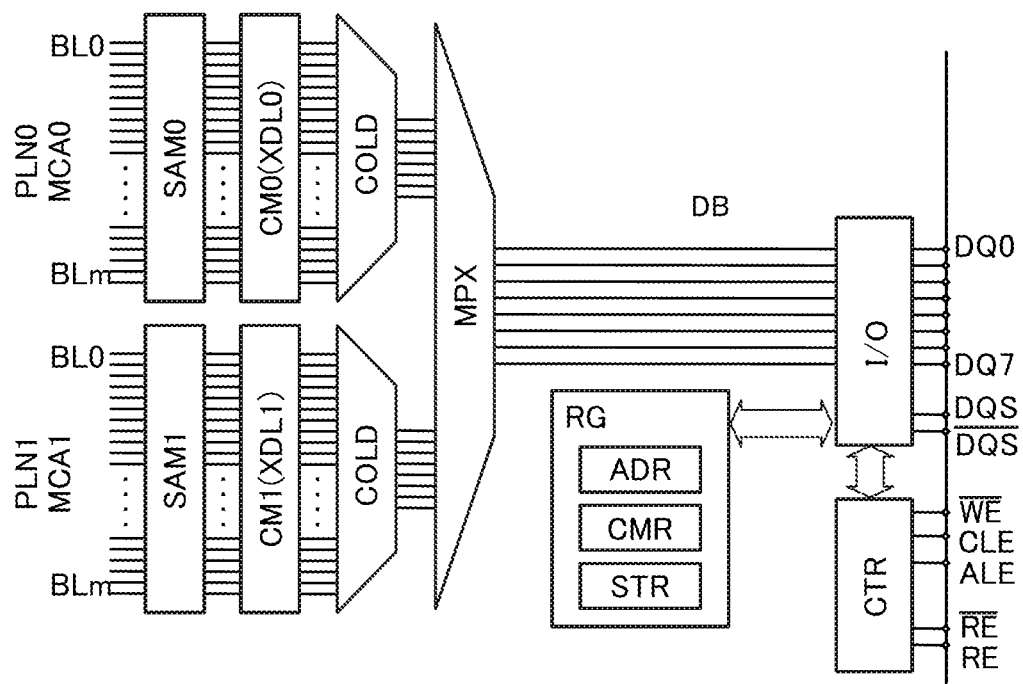
FIG. 7 is a schematic circuit diagram showing a configuration of part of the memory die MD.

FIG. 4 is a schematic block diagram showing a configuration of the memory die MD according to the first embodiment. FIG. 5 is a schematic circuit diagram showing a configuration of part of the memory die MD. FIG. 6 is a schematic perspective view showing a configuration of part of the memory die MD. FIGS. 7 and 8 are schematic circuit diagrams showing configurations of parts of the memory die MD. For convenience of description, some configurations are omitted in FIGS. 4 to 8.

Note that in FIG. 4, a plurality of control terminals, and so on, are illustrated. These plurality of control terminals are in some cases indicated as a control terminal corresponding to a high active signal (a positive logic signal), in some cases indicated as a control terminal corresponding to a low active signal (a negative logic signal), and in some cases indicated as a control terminal corresponding to both a high active signal and a low active signal. In FIG. 4, a symbol of a control terminal corresponding to a low active signal includes an overline. In the present specification, a symbol of a control terminal corresponding to a low active signal includes a slash ("/"). Note that description of FIG. 4 is an exemplification, and that a specific mode is appropriately adjustable. For example, it is possible too for some or all of the high active signals to be configured as low active signals, or for some or all of the low active signals to be configured as high active signals.

Moreover, arrows indicating input/output directions are illustrated alongside the plurality of control terminals shown in FIG. 4. In FIG. 4, a control terminal assigned with an arrow from left to right is usable in input of data or another signal from the controller die CD to the memory die MD. In FIG. 4, a control terminal assigned with an arrow from right to left is usable in output of data or another signal from the memory die MD to the controller die CD. In FIG. 4, a control terminal assigned with an arrow in both left and right directions is usable in both input of data or another signal from the controller die CD to the memory die MD and output of data or another signal from the memory die MD to the controller die CD.

As shown in FIG. 4, the memory die MD comprises: memory cell arrays MCA0, MCA1 that store user data; and a peripheral circuit PC connected to the memory cell arrays MCA0, MCA1. Note that in the description below, the memory cell arrays MCA0, MCA1 will sometimes be called memory cell arrays MCA. Moreover, the memory cell arrays MCA0, MCA1 will sometimes be called planes PLN0, PLN1.

[Configuration of Memory Cell Array MCA]

As shown in FIG. 5, the memory cell array MCA comprises a plurality of memory blocks BLK. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Moreover, the other ends of these plurality of memory strings MS are each connected to the peripheral circuit PC via a common source line SL.

The memory string MS comprises a drain side select transistor STD, a plurality of memory cells MC (memory cell transistors), a source side select transistor STS, and a source side select transistor STSb that are connected in series between the bit line BL and the source line SL. Hereafter, the drain side select transistor STD, the source side select transistor STS, and the source side select transistor STSb will sometimes simply be called select transistors (STD, STS, STSb).

The memory cell MC is a field effect type transistor comprising a semiconductor layer, a gate insulating film, and a gate electrode. The semiconductor layer functions as a channel region. The gate insulating film includes a charge accumulating film. A threshold voltage of the memory cell MC changes according to an amount of charge in the charge accumulating film. The memory cell MC stores one bit or a plurality of bits of user data. Note that the gate electrodes of the plurality of memory cells MC corresponding to one memory string MS are respectively connected with word lines WL. These word lines WL are respectively commonly connected to all of the memory strings MS in one memory block BLK.

The select transistors (STD, STS, STSb) are field effect type transistors each comprising a semiconductor layer, a gate insulating film, and a gate electrode. The semiconductor layer functions as a channel region. The gate electrodes of the select transistors (STD, STS, STSb) are respectively connected with select gate lines (SGD, SGS, SGSb). A drain side select gate line SGD, which is provided correspondingly to the string unit SU, is commonly connected to all of the memory strings MS in one string unit SU. A source side select gate line SGS is commonly connected to all of the memory strings MS in the memory block BLK. A source side select gate line SGSb is commonly connected to all of the memory strings MS in the memory block BLK.

As shown in FIG. 6, for example, the memory cell array MCA is provided above a semiconductor substrate 100. Note that in the example of FIG. 6, a plurality of transistors Tr configuring the peripheral circuit PC are provided between the semiconductor substrate 100 and the memory cell array MCA.

The memory cell array MCA comprises a plurality of the memory blocks BLK aligned in the Y direction. Moreover, an inter-block insulating layer ST of the likes of silicon oxide (SiO$_2$) is provided between two memory blocks BLK adjacent in the Y direction.

As shown in FIG. 6, for example, the memory block BLK comprises: a plurality of conductive layers 110 aligned in a Z direction; a plurality of semiconductor columns 120 extending in the Z direction; and a plurality of gate insulating films 130 respectively provided between the plurality of conductive layers 110 and the plurality of semiconductor columns 120.

The conductive layer 110 is a substantially plate-like conductive layer extending in the X direction. The conductive layer 110 may include a stacked film of a barrier conductive film of the likes of titanium nitride (TiN) and a metal film of the likes of tungsten (W), or the like. Moreover, the conductive layer 110 may include the likes of polycrystalline silicon including an impurity such as phosphorus (P) or boron (B), for example. Insulating layers 101 of the likes of silicon oxide (SiO$_2$) are provided between the plurality of conductive layers 110 aligned in the Z direction.

Moreover, two or more of the conductive layers 110 positioned in a lowermost layer, of the plurality of conductive layers 110 function as the source side select gate lines SGS, SGSb (FIG. 5) and as the gate electrodes of the pluralities of source side select transistors STS, STSb (FIG. 5) connected to these source side select gate lines SGS, SGSb. These conductive layers 110 are electrically independent every memory block BLK.

Moreover, a plurality of the conductive layers 110 positioned more upwardly than these lowermost layer-positioned conductive layers 110 function as the word lines WL (FIG. 5) and as the gate electrodes of the pluralities of memory cells MC (FIG. 5) connected to these word lines WL. These conductive layers 110 are each electrically independent every memory block BLK.

Moreover, one or a plurality of the conductive layers 110 positioned more upwardly than these word line WL-functioning conductive layers 110 function as the drain side select gate line SGD (FIG. 5) and as the gate electrodes of the plurality of drain side select transistors STD (FIG. 5) connected to this drain side select gate line SGD. These conductive layers 110 have a smaller width in the Y direction than the other conductive layers 110.

A semiconductor layer 112 is provided below the conductive layers 110. The semiconductor layer 112 may include the likes of polycrystalline silicon including an impurity such as phosphorus (P) or boron (B), for example. Moreover, the insulating layer 101 of the likes of silicon oxide (SiO$_2$) is provided between the semiconductor layer 112 and the conductive layers 110.

The semiconductor layer 112 functions as the source line SL (FIG. 5). The source line SL is commonly provided for all of the memory blocks BLK included in the memory cell array MCA, for example.

As shown in FIG. 6, for example, the semiconductor columns 120 are aligned in a certain pattern in the X direction and the Y direction. The semiconductor column 120 functions as the channel regions of the plurality of memory cells MC and the select transistors (STD, STS, STSb) included in one memory string MS (FIG. 5). The semiconductor column 120 is a semiconductor layer of the likes of polycrystalline silicon (Si), for example. As shown in FIG. 6, for example, the semiconductor column 120 has a substantially bottomed cylindrical shape, and has its central portion provided with an insulating layer 125 of the likes of silicon oxide. Moreover, an outer peripheral surface of the respective semiconductor column 120 is surrounded by the plurality of conductive layers 110, and faces the plurality of conductive layers 110.

An upper end portion of the semiconductor column 120 is provided with an impurity region 121 that includes an N type impurity of the likes of phosphorus (P). The impurity region 121 is connected to the bit line BL via a contact Ch and a contact Cb.

The gate insulating film 130 has a substantially bottomed cylindrical shape covering the outer peripheral surface of the semiconductor column 120. The gate insulating film 130 comprises a tunnel insulating film, a charge accumulating film, and a block insulating film that are stacked between the semiconductor column 120 and the conductive layers 110. The tunnel insulating film and the block insulating film are insulating films of the likes of silicon oxide ($SiO_2$), for example. The charge accumulating film is a film capable of accumulating a charge, of the likes of silicon nitride ($Si_2N_4$), for example. The tunnel insulating film, the charge accumulating film, and the block insulating film have substantially cylindrical shapes, and extend in the Z direction along the outer peripheral surface of the semiconductor column 120 excluding a contacting portion of the semiconductor column 120 and the semiconductor layer 112.

Note that the gate insulating film 130 may comprise a floating gate of the likes of polycrystalline silicon including an N type or P type impurity, for example.

End portions in the X direction of the plurality of conductive layers 110 are provided with a plurality of contacts CC. The plurality of conductive layers 110 are connected to the peripheral circuit PC via these plurality of contacts CC. As shown in FIG. 6, these plurality of contacts CC extend in the Z direction, and have their lower ends connected to the conductive layers 110. The contact CC may include, for example, a stacked film of a barrier conductive film of the likes of titanium nitride (TiN) and a metal film of the likes of tungsten (W), or the like.

[Configuration of Peripheral Circuit PC]

As shown in FIG. 4, for example, the peripheral circuit PC comprises row decoders RD0, RD1 and sense amplifiers SA0, SA1 that are respectively connected to the memory cell arrays MCA0, MCA1. In addition, the peripheral circuit PC comprises a voltage generating circuit VG and a sequencer SQC. Moreover, the peripheral circuit PC comprises an input/output control circuit I/O, a logic circuit CTR, an address register ADR, a command register CMR, a status register STR, and a data output timing adjustment unit TCT. Note that in the description below, the row decoders RD0, RD1 will sometimes be called row decoders RD, and the sense amplifiers SA0, SA1 will sometimes be called sense amplifiers SA.

[Configuration of Row Decoder RD]

As shown in FIG. 5, for example, the row decoder RD (FIG. 4) comprises: an address decoder 22 that decodes address data Add (FIG. 4); and a block select circuit 23 and voltage select circuit 24 that transfer an operation voltage to the memory cell array MCA in response to an output signal of the address decoder 22.

The address decoder 22 comprises a plurality of block select lines BLKSEL and a plurality of voltage select lines 33. The address decoder 22 sequentially refers to a row address RA of the address register ADR (FIG. 4) in accordance with a control signal from the sequencer SQC, and decodes this row address RA to set a certain block select transistor 35 and voltage select transistor 37 corresponding to the row address RA to an ON state, and set another block select transistor 35 and voltage select transistor 37 to an OFF state, for example. For example, voltages of the certain block select line BLKSEL and voltage select line 33 are set to an "H" state, and voltages of the other block select line BLKSEL and voltage select line 33 are set to an "L" state. Note that when transistors of P channel type and not N channel type are employed, these wirings are applied with reverse voltages.

Note that in the example illustrated, the block select lines BLKSEL are provided one each for each one of the memory blocks BLK, in the address decoder 22. However, this configuration may be appropriately changed. For example, the block select lines BLKSEL may be provided one each for every two or more of the memory blocks BLK.

The block select circuit 23 comprises a plurality of block select units 34 that correspond to the memory blocks BLK. The plurality of block select units 34 each comprise a plurality of the block select transistors 35 that correspond to the word lines WL and the select gate lines (SGD, SGS, SGSb). The block select transistor 35 is a field effect type voltage-withstanding transistor, for example. Drain electrodes of the block select transistors 35 are each electrically connected to a corresponding one of the word lines WL or select gate lines (SGD, SGS, SGSb). Source electrodes of the block select transistors 35 are each electrically connected to the voltage supply lines 31 via a wiring CG and the voltage select circuit 24. Gate electrodes of the block select transistors 35 are commonly connected to a corresponding one of the block select lines BLKSEL.

Note that the block select circuit 23 further comprises an unillustrated plurality of transistors. These plurality of transistors are field effect type voltage-withstanding transistors that are connected between the select gate lines (SGD, SGS, SGSb) and a voltage supply line supplied with a ground voltage $V_{SS}$. These plurality of transistors supply the ground voltage $V_{SS}$ to the select gate lines (SGD, SGS, SGSb) included in unselected memory blocks BLK. Note that the plurality of word lines WL included in the unselected memory blocks BLK are in a floating state.

The voltage select circuit 24 comprises a plurality of voltage select units 36 that correspond to the word lines WL and the select gate lines (SGD, SGS, SGSb). These plurality of voltage select units 36 each comprise a plurality of the voltage select transistors 37. The voltage select transistor 37 is a field effect type voltage-withstanding transistor, for example. Drain terminals of the voltage select transistors 37 are each electrically connected to a corresponding one of the word lines WL or select gate lines (SGD, SGS, SGSb) via one of the wirings CG and the block select circuit 23. Source terminals of the voltage select transistors 37 are each electrically connected to a corresponding one of the voltage supply lines 31. Gate electrodes of the voltage select transistors 37 are each connected to a corresponding one of the voltage select lines 33.

[Configuration of Sense Amplifier SA]

The sense amplifiers SA0, SA1 (FIG. 4) respectively comprise sense amplifier modules SAM0, SAM1 and cache memories CM0, CM1 (data registers). The cache memories CM0, CM1 respectively comprise latch circuits XDL0, XDL1.

Note that in the description below, the sense amplifier modules SAM0, SAM1 will sometimes be called sense amplifier modules SAM, the cache memories CM0, CM1 will sometimes be called cache memories CM, and the latch circuits XDL0, XDL1 will sometimes be called latch circuits XDL.

The sense amplifier module SAM comprises, for example: sense circuits respectively corresponding to the plurality of bit lines BL; and a plurality of latch circuits or the like connected to the sense circuits.

The cache memory CM comprises a plurality of the latch circuits XDL. The plurality of latch circuits XDL are respectively connected to the latch circuits within the sense amplifier module SAM. The latch circuits XDL store user data Dat to be written to the memory cell MC or user data Dat that has been read from the memory cell MC, for example.

As shown in FIG. 7, for example, the cache memory CM is connected with a column decoder COLD. The column decoder COLD decodes a column address CA stored in the address register ADR (FIG. 4), and selects the latch circuit XDL corresponding to the column address CA.

Note that user data Dat included in these plurality of latch circuits XDL is sequentially transferred to the latch circuits within the sense amplifier module SAM during a write operation. Moreover, user data Dat included in the latch circuits within the sense amplifier module SAM is sequentially transferred to the latch circuits XDL during a read operation. Moreover, user data Dat included in the latch circuits XDL is sequentially transferred to the input/output control circuit I/O via the column decoder COLD and a multiplexer MPX during a later-mentioned data-out operation.

[Configuration of Voltage Generating Circuit VG]

As shown in FIG. 5, for example, the voltage generating circuit VG (FIG. 4) is connected to a plurality of the voltage supply lines 31. The voltage generating circuit VG includes a step-down circuit such as a regulator, and a booster circuit such as a charge pump circuit 32, for example. These step-down circuit and booster circuit are each connected to voltage supply lines supplied with a power supply voltage $V_{cc}$ and the ground voltage $V_{ss}$ (FIG. 4). These voltage supply lines are connected to the pad electrodes P described with reference to FIGS. 2 and 3, for example. The voltage generating circuit VG generates and simultaneously outputs to the plurality of voltage supply lines 31 a plurality of types of operation voltages that are applied to the bit lines BL, the source line SL, the word lines WL, and the select gate lines (SGD, SGS, SGSb) during a read operation, a write operation, and an erase operation on the memory cell array MCA, according to a control signal from the sequencer SQC, for example. The operation voltages outputted from the voltage supply lines 31 are appropriately adjusted according to the control signal from the sequencer SQC.

[Configuration of Sequencer SQC]

The sequencer SQC (FIG. 4) outputs an internal control signal to the row decoders RD0, RD1, the sense amplifier modules SAM0, SAM1, and the voltage generating circuit VG, in accordance with command data Cmd stored in the command register CMR. In addition, the sequencer SQC appropriately outputs to the status register STR status data Stt indicating a state of the memory die MD.

Moreover, the sequencer SQC generates a ready/busy signal, and outputs the ready/busy signal to a terminal RY//BY. The terminal RY//BY is in an "L" state during execution of an operation for supplying a voltage to the memory cell array MCA, such as a read operation, a write operation, or an erase operation, and is in an "H" state in other cases, for example. Note that even if the memory cell array MCA undergoes execution of an operation in which it is not supplied with a voltage, such as the later-mentioned data-out operation, status-read, and so on, the terminal RY//BY will not be in an "L" state. In a period when the terminal RY//BY is in an "L" state (a busy period), access to the memory die MD is basically prohibited. Moreover, in a period when the terminal RY//BY is in an "H" state (a ready period), access to the memory die MD is allowed. Note that the terminal RY//BY is realized by the pad electrode P described with reference to FIGS. 2 and 3, for example.

Moreover, the sequencer SQC comprises a feature register FR. The feature register FR is a register holding a value indicating in which mode, of later-mentioned operating mode MODEa and operating mode MODEb operation is being performed.

[Configuration of Address Register ADR]

As shown in FIG. 4, the address register ADR is connected to the input/output control circuit I/O and stores address data Add that has been inputted from the input/output control circuit I/O. The address register ADR comprises a plurality of 8-bit register columns, for example. The register column holds address data Add corresponding to an under-execution internal operation such as a read operation, a write operation, or an erase operation, when the internal operation is executed, for example.

Note that the address data Add includes the column address CA (FIG. 4) and the row address RA (FIG. 4), for example. The row address RA includes, for example: a block address specifying the memory block BLK (FIG. 5); a page address specifying the string unit SU and the word line WL; a plane address specifying the memory cell array MCA (plane); and a chip address specifying the memory die MD.

[Configuration of Command Register CMR]

The command register CMR is connected to the input/output control circuit I/O and stores command data Cmd that has been inputted from the input/output control circuit I/O. The command register CMR comprises at least one set of 8-bit register columns, for example. When command data Cmd is stored in the command register CMR, a control signal is transmitted to the sequencer SQC.

[Configuration of Status Register STR]

The status register STR is connected to the input/output control circuit I/O and stores status data Stt to be outputted to the input/output control circuit I/O. The status register STR comprises a plurality of 8-bit register columns, for example. The register column holds status data Stt relating to an under-execution internal operation such as a read operation, a write operation, or an erase operation, when the internal operation is executed, for example. Moreover, the register column holds ready/busy information of the memory cell arrays MCA0, MCA1, for example.

[Configuration of Data Output Timing Adjustment Unit TCT]

The data output timing adjustment unit TCT is connected to a bus wiring DB between the cache memories CM0, CM1 and the input/output control circuit I/O. In such cases as when, for example, the cache memories CM0, CM1 consecutively undergo execution of the later-mentioned data-out operation, the data output timing adjustment unit TCT adjusts a start timing of the data-out operation on the cache memory CM1 in order for the data-out operation of the cache memory CM1 to be started without delay after completion of the data-out operation of the cache memory CM0.

[Configuration of Input/Output Control Circuit I/O] The input/output control circuit I/O (FIG. 4) comprises data signal input/output terminals DQ0-DQ7, data strobe signal input/output terminals DQS, /DQS, a shift register, and a buffer circuit.

The data signal input/output terminals DQ0-DQ7 and the data strobe signal input/output terminals DQS, /DQS are each realized by the pad electrode P described with reference to FIGS. 2 and 3, for example. Data that has been inputted via the data signal input/output terminals DQ0-DQ7 is inputted to the cache memory CM, the address register ADR, or the command register CMR from the buffer circuit, depending on an internal control signal from the logic circuit CTR. Moreover, data to be outputted via the data signal input/output terminals DQ0-DQ7 is inputted to the buffer circuit from the cache memory CM or the status register STR, depending on an internal control signal from the logic circuit CTR.

Signals that have been inputted via the data strobe signal input/output terminals DQS, /DQS (for example, a data strobe signal and complementary signal thereof) are employed in input of data via the data signal input/output terminals DQ0-DQ7. The data that has been inputted via the data signal input/output terminals DQ0-DQ7 is imported into the shift register in the input/output control circuit I/O at a timing of a rising edge of voltage (switching of input signal) of the data strobe signal input/output terminal DQS and falling edge of voltage (switching of input signal) of the data strobe signal input/output terminal /DQS and a timing of a falling edge of voltage (switching of input signal) of the data strobe signal input/output terminal DQS and rising edge of voltage (switching of input signal) of the data strobe signal input/output terminal /DQS.

As shown in FIG. 8, for example, the data signal input/output terminals DQ0-DQ7 and the data strobe signal input/output terminals DQS, /DQS are each connected to an input circuit 201 and an output circuit 202. The input circuit 201 is a receiver such as a comparator, for example. The output circuit 202 is a driver such as an OCD (Off Chip Driver) circuit, for example.

[Configuration of Logic Circuit CTR]

The logic circuit CTR (FIG. 4) comprises: a plurality of external control terminals/CE, CLE, ALE, /WE, /RE, RE, /WP; and a logic circuit connected to these plurality of external control terminals/CE, CLE, ALE, /WE, /RE, RE, /WP. The logic circuit CTR receives an external control signal from the controller die CD via the external control terminals/CE, CLE, ALE, /WE, /RE, RE, /WP and outputs an internal control signal to the input/output control circuit I/O depending on this external control signal.

As shown in FIG. 8, for example, the external control terminals/CE, CLE, ALE, /WE, /RE, RE, /WP are each connected to the input circuit 201. Note that the external control terminals/CE, CLE, ALE, /WE, /RE, RE, /WP are each realized by the pad electrode P described with reference to FIGS. 2 and 3, for example.

A signal that has been inputted via the external control terminal /CE (for example, a chip enable signal) is employed in selection of the memory die MD. A memory die MD whose external control terminal /CE has been inputted with "L" is in a state where input/output of command data Cmd and address data Add (hereafter, sometimes simply called "data") thereto/therefrom is possible. A memory die MD whose external control terminal /CE has been inputted with "H" is in a state where input/output of data thereto/therefrom is not possible. Note that as shown in FIG. 8, the external control terminal /CE is connected to the input circuit 201.

A signal that has been inputted via the external control terminal CLE (for example, a command latch enable signal) is employed in use of the command register CMR, and so on. A function, and so on, of the external control terminal CLE will be mentioned later.

A signal that has been inputted via the external control terminal ALE (for example, an address latch enable signal) is employed in use of the address register ADR, and so on. A function, and so on, of the external control terminal ALE will be mentioned later.

A signal that has been inputted via the external control terminal /WE (for example, a write enable signal) is employed in input of data from the controller die CD to the memory die MD, and so on. A function, and so on, of the external control terminal /WE will be mentioned later.

Signals that have been inputted via the external control terminals/RE, RE (for example, a read enable signal and complementary signal thereof) are employed in output of data via the data signal input/output terminals DQ0-DQ7. Data to be outputted from the data signal input/output terminals DQ0-DQ7 is switched at a timing of a falling edge of voltage (switching of input signal) of the external control terminal /RE and rising edge of voltage (switching of input signal) of the external control terminal RE and a timing of a rising edge of voltage (switching of input signal) of the external control terminal /RE and falling edge of voltage (switching of input signal) of the external control terminal RE.

A signal that has been inputted via the external control terminal /WP (for example, a write protect signal) is employed in restriction of input of user data Dat from the controller die CD to the memory die MD, and so on.

[Operating Mode MODEa and Operating Mode MODEb]

The semiconductor memory device according to the present embodiment is capable of being operated in operating mode MODEa and operating mode MODEb. Operating mode MODEa and operating mode MODEb will be described below with reference to FIGS. 9 to 19.

[Roles of External Terminals in Each Mode]

Figure 9:
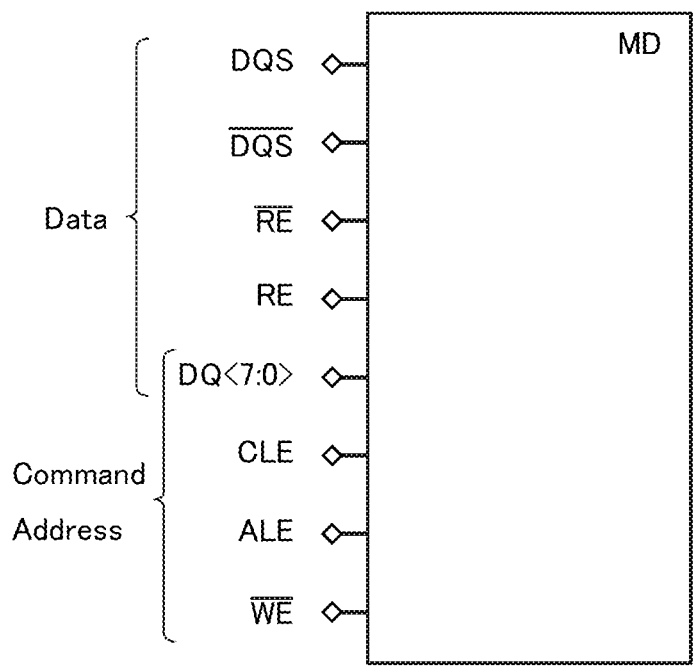
FIG. 9 is a schematic view for explaining operating mode MODEa.
Figure 10:
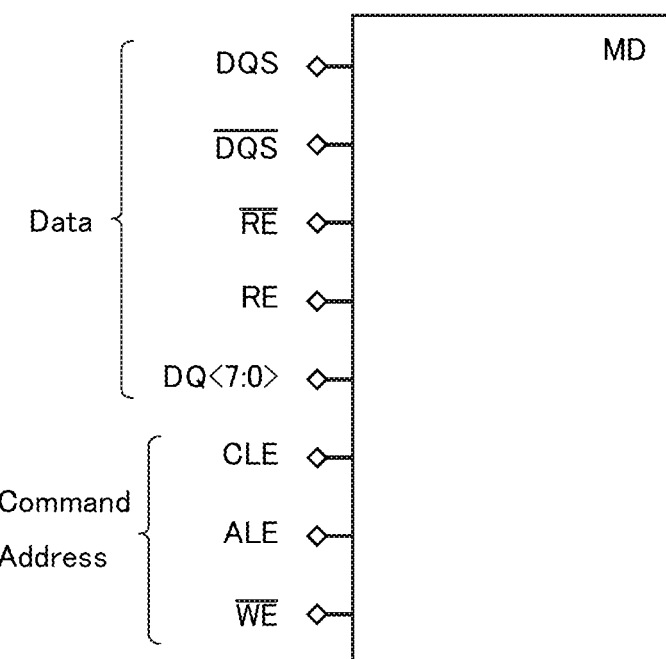
FIG. 10 is a schematic view for explaining operating mode MODEb.

FIG. 9 is a schematic view for explaining roles of the signal input/output terminals and the external control terminals in operating mode MODEa. FIG. 10 is a schematic view for explaining roles of the signal input/output terminals and the external control terminals in operating mode MODEb. Note that in the description below, the data signal input/output terminals DQ0-DQ7 will sometimes be notated as data signal input/output terminals DQ<7:0>.

In operating mode MODEa, as shown in FIG. 9, for example, the data signal input/output terminals DQ<7:0> are used in input of command data Cmd and address data Add, as well as in input/output of user data Dat.

On the other hand, in operating mode MODEb, as shown in FIG. 10, for example, although the data signal input/output terminals DQ<7:0> are used in input/output of user data Dat, they are not used in input of command data Cmd and address data Add. In operating mode MODEb, the external control terminals CLE, ALE are used in input of command data Cmd and address data Add.

[Roles of External Terminals in Operating Mode MODEa]

FIG. 11 is a truth table for explaining roles of the external terminals in operating mode MODEa. Note that in FIG. 11, "Z" indicates a case where either of "H" and "L" may be inputted. "X" indicates a case where an inputted signal is fixed at "H" or "L". "Input" indicates a case where input of data is performed. "Output" indicates a case where output of data is performed.

When command data Cmd is inputted in operating mode MODEa, the controller die CD raises the external control terminal /WE from "L" to "H" in a state where voltages of the data signal input/output terminals DQ<7:0> have been set to "H" or "L" depending on each of bits of the 8-bit command data Cmd, the external control terminal CLE has been inputted with "H", and the external control terminal ALE has been inputted with "L", for example.

When the external control terminals CLE, ALE are being inputted with "H, L", data that has been inputted via the data signal input/output terminals DQ<7:0> is stored in a buffer memory in the input/output control circuit I/O as command data Cmd, and transferred to the command register CMR (FIG. 4).

Moreover, when address data Add is inputted, the controller die CD raises the external control terminal /WE from "L" to "H" in a state where voltages of the data signal input/output terminals DQ<7:0> have been set to "H" or "L" depending on each of bits of 8-bit data configuring the address data Add, the external control terminal CLE has been inputted with "L", and the external control terminal ALE has been inputted with "H", for example.

When the external control terminals CLE, ALE are being inputted with "L, H", data that has been inputted via the data signal input/output terminals DQ<7:0> is stored in the buffer memory in the input/output control circuit I/O as address data Add, and transferred to the address register ADR (FIG. 4).

Moreover, when user data Dat is inputted, the controller die CD switches (toggles) input signals of the data strobe signal input/output terminals DQS, /DQS in a state where voltages of the data signal input/output terminals DQ<7:0> have been set to "H" or "L" depending on each of bits of 8-bit data configuring the user data Dat, the external control terminal CLE has been inputted with "L", and the external control terminal ALE has been inputted with "L", for example.

When the external control terminals CLE, ALE are both being inputted with "L, data that has been inputted via the data signal input/output terminals DQ<7:0> is stored in the buffer memory in the input/output control circuit I/O as user data Dat, and transferred to the cache memory CM (FIG. 4) via the bus wiring DB.

Moreover, when user data Dat or status data Stt is outputted, the controller die CD switches (toggles) input signals of the external control terminals/RE, RE, for example. As a result, the eight bits of outputted user data Dat or status data Stt are outputted to the data signal input/output terminals DQ<7:0>. In addition, output signals of the data strobe signal input/output terminals DQS, /DQS are switched.

Moreover, when the memory die MD is set to a standby state, the controller die CD inputs "H" to the external control terminal /CE, for example.

Moreover, when the memory die MD is set to a bus idle state, the controller die CD inputs "H" to the external control terminal /WE, for example.

[Roles of External Terminals in Operating Mode MODEb]

FIGS. 12 and 13 are truth tables for explaining roles of the external terminals in operating mode MODEb. Note that in FIGS. 12 and 13, "Z" indicates a case where either of "H" and "L" may be inputted. "X" indicates a case where an inputted signal is fixed at "H" or "L". "Input" indicates a case where input of data is performed. "Output" indicates a case where output of data is performed.

As mentioned above, in operating mode MODEb, the external control terminals CLE, ALE are used in input of command data Cmd and address data Add. Now, as will be mentioned later with reference to FIG. 15, when input of command data Cmd or address data Add is performed in operating mode MODEb, the controller die CD inputs the memory die MD with a signal indicating whether next-to-be-inputted data will be command data Cmd or will be address data Add. Hereafter, such a signal will be called an input/output data select signal.

FIG. 12 shows roles of the external control terminals in a period MSel (FIG. 15) when the input/output data select signal is inputted. FIG. 13 shows roles of the external control terminals in a period S_In (FIG. 15) after input of the input/output data select signal.

In the period MSel, when an input/output data select signal to the effect that command data Cmd is to be inputted is inputted, the controller die CD raises the external control terminal /WE from "L" to "H" in a state where the external control terminal CLE has been inputted with "H", and the external control terminal ALE has been inputted with "L", for example.

In the period MSel, when the external control terminal CLE has been inputted with "H" and the external control terminal ALE has been inputted with "L", data inputted in the period S_In immediately after this period MSel is stored in the buffer memory in the input/output control circuit I/O as command data Cmd, and transferred to the command register CMR (FIG. 4).

Moreover, in period MSel, when an input/output data select signal to the effect that address data Add is to be inputted is inputted, the controller die CD raises the external control terminal /WE from "L" to "H" in a state where the external control terminal CLE has been inputted with "L", and the external control terminal ALE has been inputted with "H", for example.

In the period MSel, when the external control terminal CLE has been inputted with "L" and the external control terminal ALE has been inputted with "H", data inputted in the period S_In immediately after this period MSel is stored in the buffer memory in the input/output control circuit I/O as address data Add, and transferred to the address register ADR (FIG. 4).

In the period S_In, when command data Cmd or address data Add is inputted, the controller die CD sets voltages of the external control terminals CLE, ALE to "H" or "L" depending on each of bits of 2-bit data configuring the command data Cmd or address data Add, and raises the external control terminal /WE from "L" to "H", for example.

Note that when user data Dat is inputted in operating mode MODEb, the controller die CD switches input signals of the data strobe signal input/output terminals DQS, /DQS in a state where voltages of the data signal input/output terminals DQ<7:0> have been set to "H" or "L" depending on each of bits of 8-bit data configuring the user data Dat, and the external control terminals/RE, RE have been inputted with "H, L", for example. This operation is executable both in the period MSel and in the period S_In.

In operating mode MODEb, data that has been inputted via the data signal input/output terminals DQ<7:0> is stored in the buffer memory in the input/output control circuit I/O as user data Dat, and transferred to the cache memory CM via the bus wiring DB.

Moreover, when user data Dat or status data Stt is outputted, the controller die CD switches input signals of the external control terminals/RE, RE, for example. As a result, the eight bits of outputted user data Dat or status data Stt are outputted to the data signal input/output terminals DQ<7:0>. In addition, output signals of the data strobe signal input/output terminals DQS, /DQS are switched. This operation is executable both in the period MSel and in the period S_In.

Moreover, when the memory die MD is set to a standby state, the controller die CD inputs "H" to the external control terminal /CE, for example.

Moreover, when the memory die MD is set to a bus idle state, the controller die CD inputs "H" to the external control terminal /WE, for example.

[Examples of Signal Input/Output in Each Mode]

Figure 14:
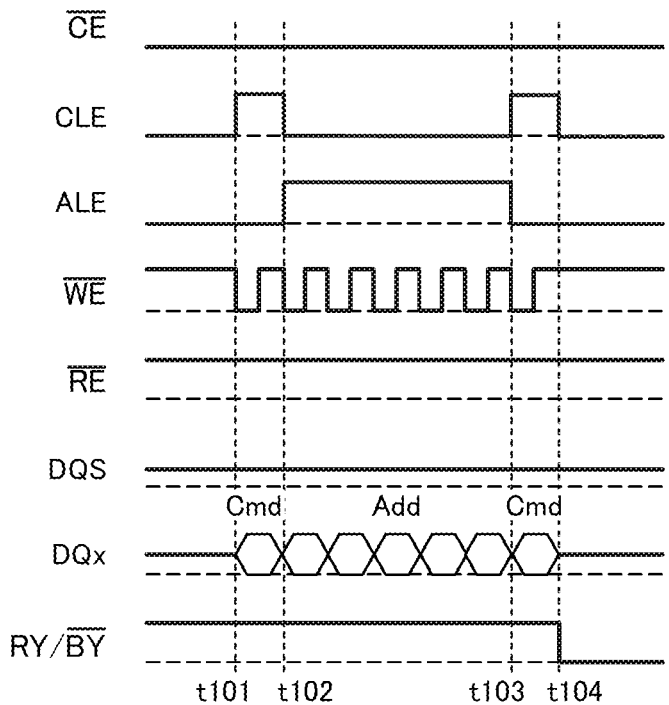
FIG. 14 is a schematic waveform diagram for explaining operating mode MODEa.
Figure 15:
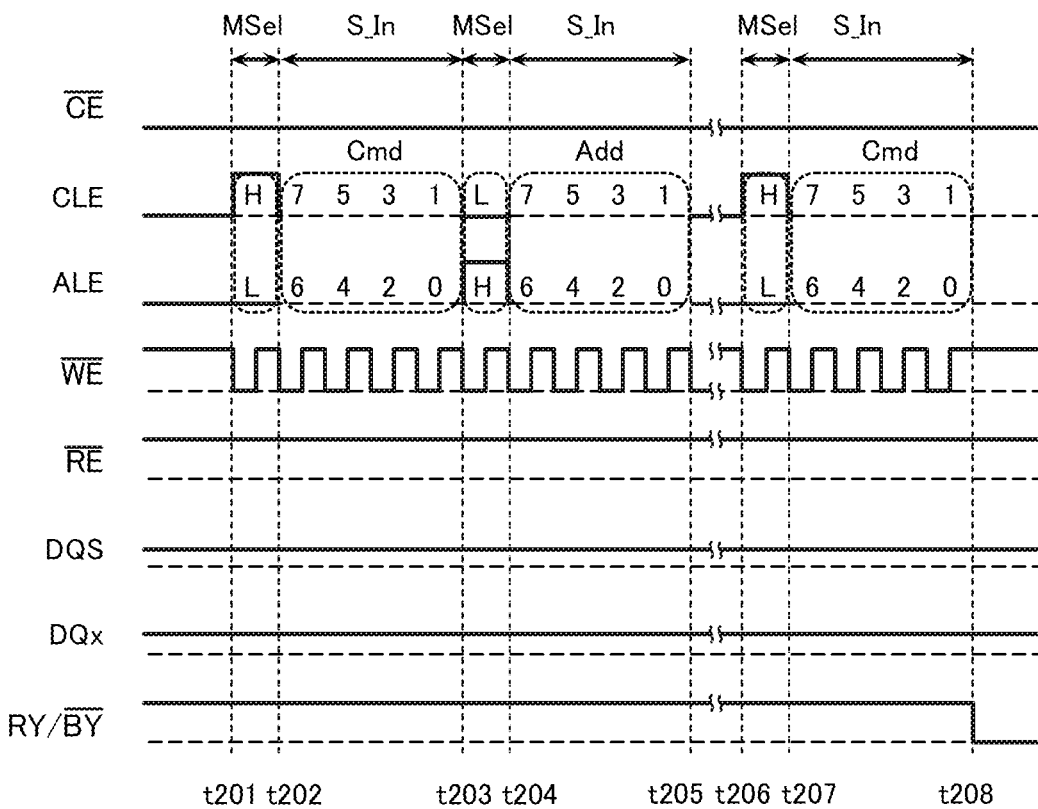
FIG. 15 is a schematic waveform diagram for explaining operating mode MODEb.

FIGS. 14 and 15 are schematic waveform diagrams for explaining operation of the memory die MD according to the first embodiment.

FIG. 14 shows waveforms when command data Cmd and address data Add are inputted in operating mode MODEa. In the example of FIG. 14, at timing t101, the controller die CD is inputting the memory die MD with command data Cmd. Moreover, at timing t102, the controller die CD is inputting the memory die MD with address data Add. Note that although in the example illustrated, five cycles of the 8-bit data configuring the address data Add are being inputted from timing t102 to timing t103, the number of cycles may be fewer than or more than five. In addition, at timing t103, the controller die CD is inputting the memory die MD with command data Cmd. Moreover, at timing t104, an operation such as a read operation is started, and voltage of the terminal RY//BY falls from "H" to "L".

FIG. 15 shows waveforms when command data Cmd and address data Add are inputted in operating mode MODEb. In the example of FIG. 15, the external control terminal /WE is inputted with "L" and "H" at substantially a constant pace. Moreover, a period from when, at a certain timing, an input signal of the external control terminal /WE once falls until when it once again falls is indicated as the above-mentioned period MSel. Moreover, a period from when the input signal of the external control terminal /WE falls upon completion of the period MSel until when the input signal of the external control terminal /WE has fallen a further four times is indicated as the above-mentioned period S_In.

In the example of FIG. 15, in period MSel from timing t201 to timing t202, the controller die CD is inputting the memory die MD with the input/output data select signal specifying input of command data Cmd.

Moreover, in period S_In from timing t202 to timing t203, the controller die CD is inputting the memory die MD with the command data Cmd.

Now, in the example of FIG. 15, in the period S_In, the controller die CD is inputting the memory die MD with 8-bit command data Cmd two bits at a time divided into four cycles. For example, the 8-bit command data Cmd is assumed to be bits "7" to "0". First, in a first cycle of data input, the external control terminal /WE is raised from "L" to "H" in a state where voltages of the external control terminals CLE, ALE have been set to "H" or "L" depending on the bits "7" and "6". Similarly, in second through fourth cycles of data input too, the external control terminal /WE is raised from "L" to "H" in a state where voltages of the external control terminals CLE, ALE have been set to "H" or "L" depending on, respectively, the bits "5" and "4", the bits "3" and "2", and the bits "1" and "0".

Moreover, in period MSel from timing t203 to timing t204, the controller die CD is inputting the memory die MD with the input/output data select signal specifying input of address data Add.

Moreover, in period S_In from timing t204 to timing t205, the controller die CD is inputting the memory die MD with the address data Add.

Now, in the example of FIG. 15, in the period S_In, the controller die CD is inputting the memory die MD with 8-bit data configuring the address data Add two bits at a time divided into four cycles.

Note that similarly, from timing t205 to timing t206 too, data configuring address data Add is inputted two bits at a time, although illustration of this is omitted.

Moreover, in period MSel from timing t206 to timing t207, similarly to from timing t201 to timing t202, the input/output data select signal specifying input of command data Cmd is being inputted.

Moreover, in period S_In from timing t207 to timing t208, the controller die CD is inputting the memory die MD with the command data Cmd. Moreover, at the timing t208, an operation such as a read operation is started, and voltage of the terminal RY//BY falls from "H" to "L".

[Operation]

Next, operation of the memory die MD will be described.

The memory die MD is configured to execute a read operation. The read operation is an operation in which user data Dat is read from the memory cell array MCA by the sense amplifier module SAM, and the read user data Dat is transferred to the latch circuit XDL. In the read operation, the user data Dat that has been read from the memory cell array MCA is transferred to the latch circuit XDL via the bit lines BL and the sense amplifier module SAM.

Moreover, the memory die MD is configured to execute a data-out operation. The data-out operation is an operation in which user data Dat included in the latch circuit XDL is outputted to the controller die CD. In the data-out operation, the user data Dat included in the latch circuit XDL is outputted to the controller die CD via the column decoder COLD, multiplexer MPX, bus wiring DB, and input/output control circuit I/O described with reference to FIG. 7.

Moreover, the memory die MD is configured to execute a status-read. The status-read is an operation in which status data Stt included in the status register STR is outputted to the controller die CD. In the status-read, the status data Stt included in the status register STR is outputted to the controller die CD via the input/output control circuit I/O or the logic circuit CTR.

[Read Operation and Data-Out Operation in Operating Mode MODEa]

Figure 16:
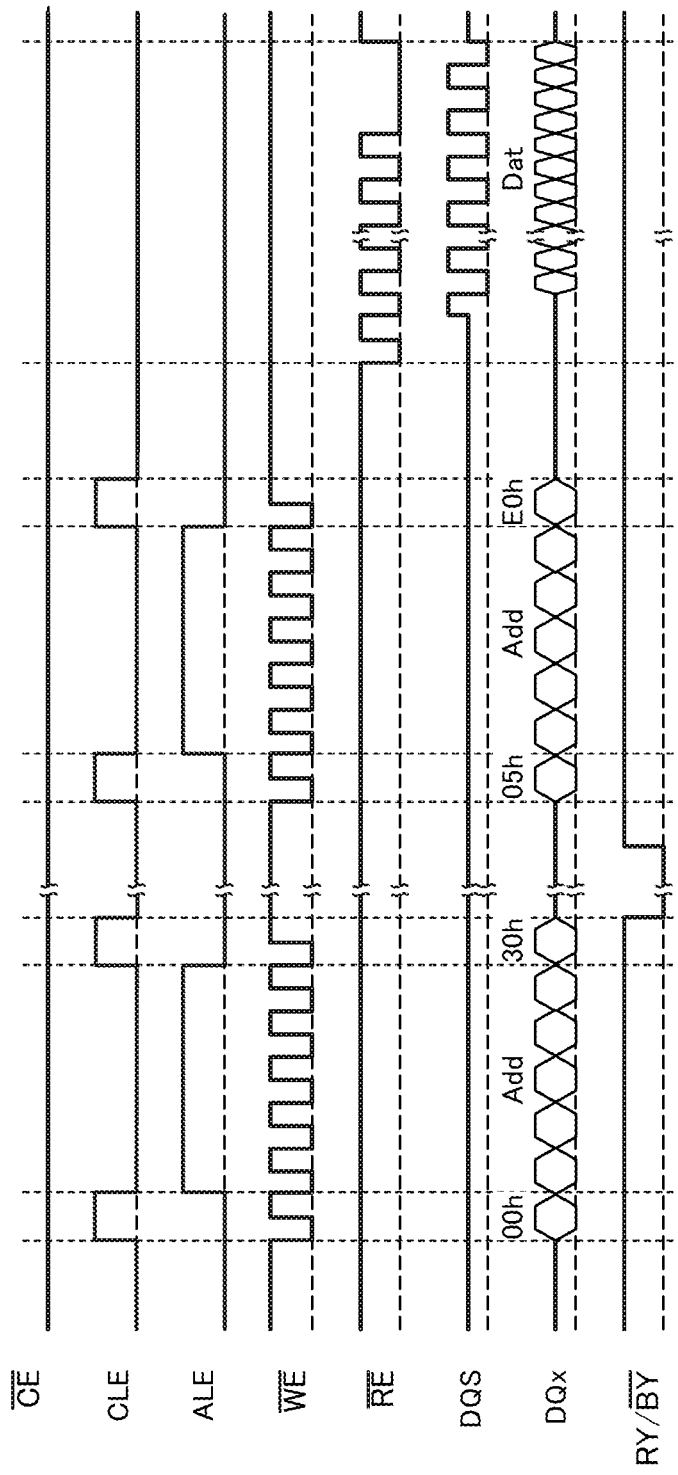
FIG. 16 is a schematic timing chart for explaining operating mode MODEa.

FIG. 16 is a schematic timing chart showing a situation when the read operation and the data-out operation are executed in operating mode MODEa. In the example of FIG. 16, the memory die MD is set to operating mode MODEa.

In the example of FIG. 16, first, command data "00h", address data Add, and command data "30h" are sequentially inputted via the data signal input/output terminals DQ<7:0>. The command data "00h" is command data Cmd inputted at the start of a command set instructing the read operation. The command data "30h" is command data Cmd inputted at the end of a command set instructing the read operation.

Due to input of the command data "00h", the address data Add, and the command data "30h", the read operation is started, and voltage of the terminal RY//BY falls from "H" to "L". In addition, user data Dat is transferred to the latch circuit XDL. Moreover, at a timing when the read operation has ended, the voltage of the terminal RY//BY rises from "L" to "H".

Next, command data "05h", address data Add, and command data "E0h" are sequentially inputted via the data signal input/output terminals DQ<7:0>. The command data "05h" is command data Cmd inputted at the start of a command set instructing the data-out operation. The command data "E0h" is command data Cmd inputted at the end of a command set instructing the data-out operation.

Due to input of the command data "05h", the address data Add, and the command data "E0h", the controller die CD switches (toggles) input signals of the external control terminals /RE, RE after a certain standby time. As a result, the data-out operation is started, and the user data Dat is outputted via the data signal input/output terminals DQ.

Figure 17:
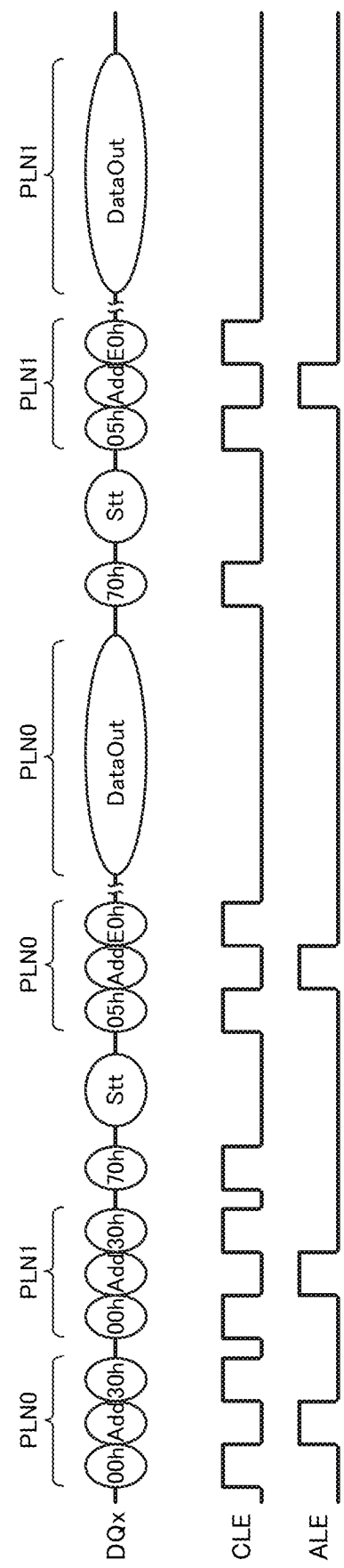
FIG. 17 is a schematic timing chart for explaining operating mode MODEa.

FIG. 17 is a schematic timing chart showing another situation when the read operation and the data-out operation are executed in operating mode MODEa. In the example of FIG. 17, the memory die MD is set to operating mode MODEa.

In the example of FIG. 17, first, command data "00h", address data Add, and command data "30h" are sequentially inputted via the data signal input/output terminals DQ<7:0>. The address data Add included in this command set includes information of the plane PLN0 (FIG. 4) to be targeted for the read operation, as the above-described plane address.

Due to input of the command data "00h", the address data Add, and the command data "30h", the read operation is started on the plane PLN0, and the user data Dat is transferred to the latch circuit XDL0.

Next, command data "00h", address data Add, and command data "30h" are sequentially inputted via the data signal input/output terminals DQ<7:0>. The address data Add included in this command set includes information of the plane PLN1 (FIG. 4) to be targeted for the read operation, as the above-described plane address.

Due to input of the command data "00h", the address data Add, and the command data "30h", the read operation is started on the plane PLN1, and the user data Dat is transferred to the latch circuit XDL1.

Next, command data "70h" is inputted via the data signal input/output terminals DQ<7:0>. The command data "70h" is command data instructing the status-read. Due to input of the command data "70h", the status-read is performed, and status data Stt is outputted via the data signal input/output terminals DQ<7:0>.

Next, command data "05h", address data Add, and command data "E0h" are sequentially inputted via the data signal input/output terminals DQ<7:0>. The address data Add included in this command set includes information of the plane PLN0 (FIG. 4) to be targeted for the data-out operation, as the above-described plane address.

Due to input of the command data "05h", the address data Add, and the command data "E0h", the controller die CD switches (toggles) input signals of the external control terminals /RE, RE after a certain standby time. As a result, the data-out operation is started on the plane PLN0, and user data "DataOut" is outputted via the data signal input/output terminals DQ<7:0>.

After completion of the data-out operation on the plane PLN0, command data "70h" is inputted via the data signal input/output terminals DQ<7:0>. Due to input of the command data "70h", the status-read is performed again, and status data Stt is outputted via the data signal input/output terminals DQ<7:0>.

Next, similarly to in the data-out operation on the plane PLN0, command data "05h", address data Add, and command data "E0h" are sequentially inputted via the data signal input/output terminals DQ<7:0>. The address data Add included in this command set includes information of the plane PLN1 (FIG. 4) to be targeted for the data-out operation, as the above-described plane address.

After a certain time has elapsed, the controller die CD switches (toggles) input signals of the external control terminals /RE, RE. As a result, the data-out operation is started on the plane PLN1, and user data "DataOut" is outputted via the data signal input/output terminals DQ<7:0>.

[Read Operation and Data-Out Operation in Operating Mode MODEb]

Figure 18:
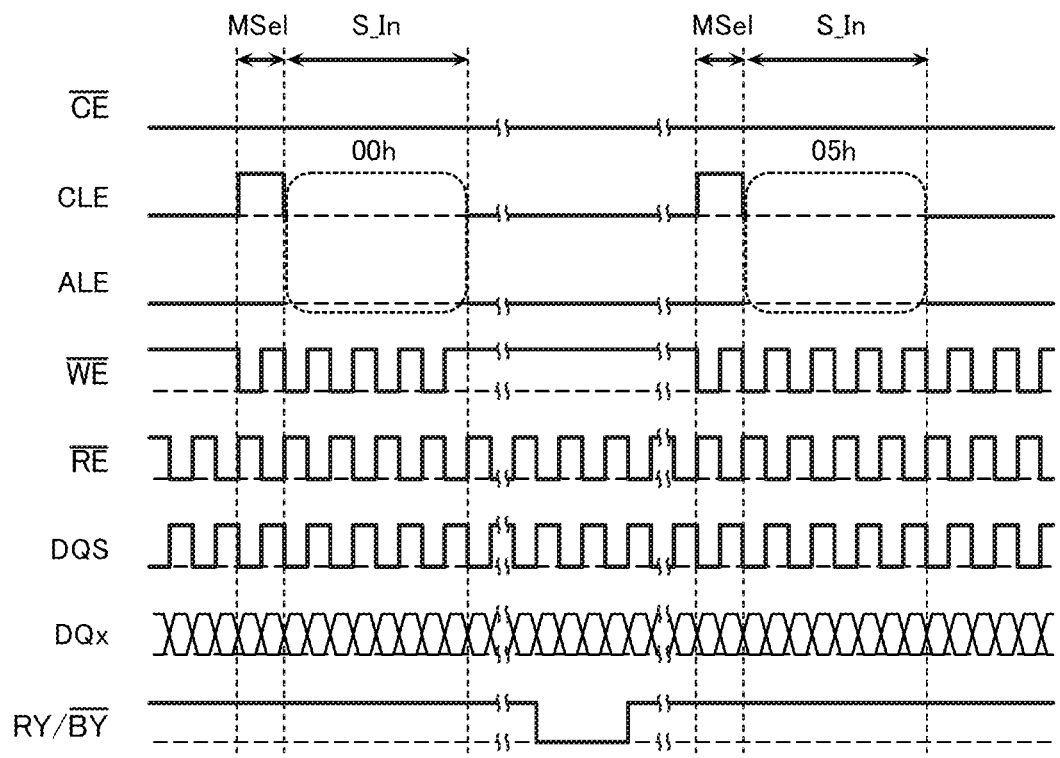
FIG. 18 is a schematic timing chart for explaining operating mode MODEb.

FIG. 18 is a schematic timing chart showing a situation when the read operation and the data-out operation are executed in operating mode MODEb. In the example of FIG. 18, the memory die MD is set to operating mode MODEb.

In the example of FIG. 18, first, a command set including the command data "00h" is inputted via the external control terminals CLE, ALE. Next, a command set including the command data "05h" is inputted via the external control terminals CLE, ALE. Note that in operating mode MODEb, input/output of data via the data signal input/output terminals DQ<7:0> and input/output of data via the external control terminals CLE, ALE are executable at independent timings. For example, in the example of FIG. 18, input of these command sets is performed during execution of the data-out operation (during a period when input signals of the external control terminals /RE, RE are toggled).

Figure 19:
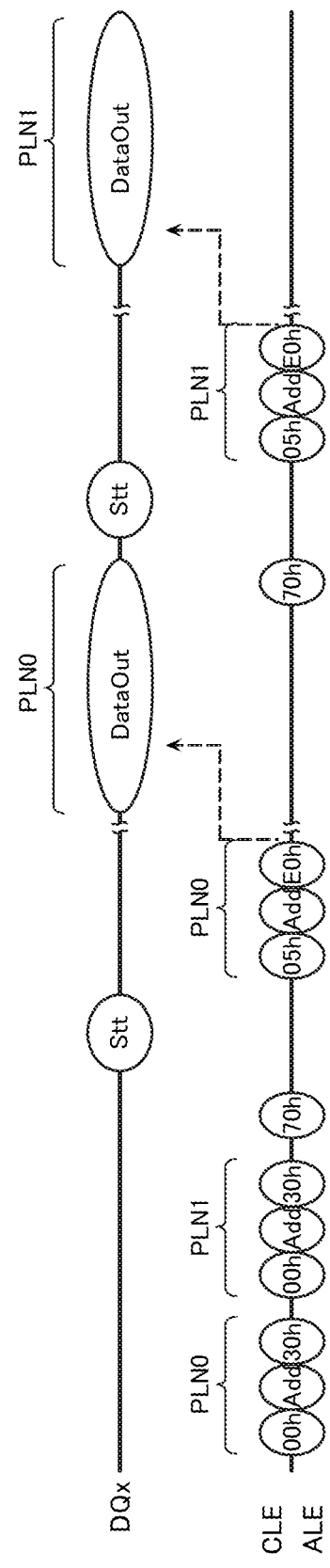
FIG. 19 is a schematic timing chart for explaining operating mode MODEb.

FIG. 19 is a schematic timing chart showing another situation when the read operation and the data-out operation are executed in operating mode MODEb. In the example of FIG. 19, the memory die MD is set to operating mode MODEb.

In the example of FIG. 19, first, command data "00h", address data Add, and command data "30h" are sequentially inputted via the external control terminals CLE, ALE. The address data Add included in this command set includes information of the plane PLN0 (FIG. 4) to be targeted for the read operation, as the above-described plane address.

Next, command data "00h", address data Add, and command data "30h" are sequentially inputted via the external control terminals CLE, ALE. The address data Add included in this command set includes information of the plane PLN1 (FIG. 4) to be targeted for the read operation, as the above-described plane address.

Next, command data "70h" is inputted via the external control terminals CLE, ALE. Due to input of the command data "70h", the status-read is performed, and status data Stt is outputted via the data signal input/output terminals DQ<7:0>.

Next, command data "05h", address data Add, and command data "E0h" are sequentially inputted via the external control terminals CLE, ALE. This address data Add includes information of the plane PLN0 (FIG. 4) to be targeted for the data-out operation, as the above-described plane address.

After a certain standby time, the data-out operation is started on the plane PLN0, and user data "DataOut" is outputted via the data signal input/output terminals DQ<7:0>.

Moreover, in the example of FIG. 19, command data "70h" is inputted via the external control terminals CLE, ALE while the data-out operation on the plane PLN0 is being performed. Due to input of the command data "70h", the status-read is performed. After completion of the data-out operation on the plane PLN0, status data Stt is outputted via the data signal input/output terminals DQ<7:0>.

Next, command data "05h", address data Add, and command data "E0h" are sequentially inputted via the external control terminals CLE, ALE. This address data Add includes the likes of an address of the plane PLN1 (FIG. 4) to be targeted for the data-out operation, as the above-described plane address.

Now, in operating mode MODEb, unlike in operating mode MODEa, the data output timing adjustment unit TCT (FIG. 4) adjusts the timing of start of the data-out operation on the plane PLN1. After completion of the data-out operation on the plane PLN0, the data-out operation is started on the plane PLN1 and user data "DataOut" is outputted via the data signal input/output terminals DQ<7:0>, in response to an internal signal generated by the data output timing adjustment unit TCT.

Advantages

The semiconductor memory device according to the present embodiment is capable of being operated in operating mode MODEb. In operating mode MODEb, as mentioned above, input of command data Cmd and address data Add can be performed via the external control terminals CLE, ALE even while the data-output operation via the data signal input/output terminals DQ<7:0> is being performed. Hence, time required for input of the command set to the memory die MD can be significantly reduced. As a result, speeding-up of operation of the semiconductor memory device can be realized.

[Circuits Applicable to Memory Die MD in First Embodiment]

Figure 20:
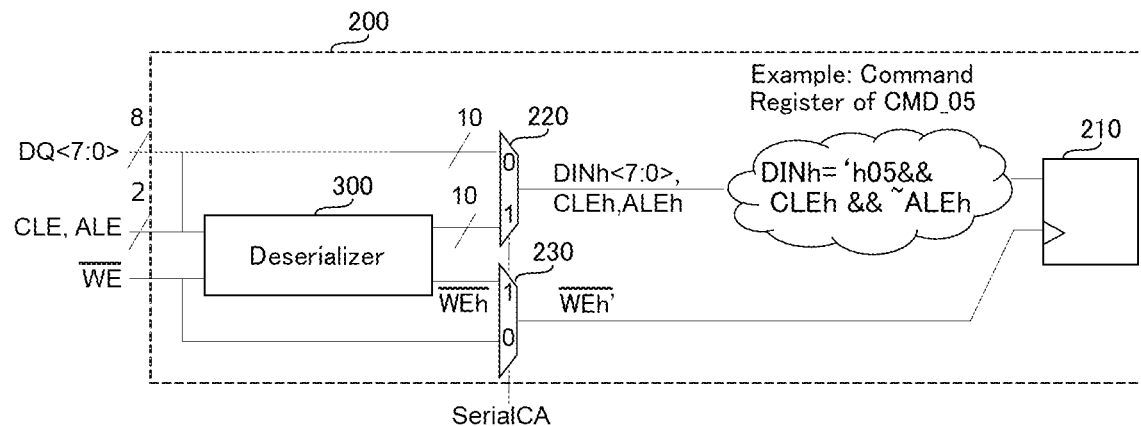
FIG. 20 is a schematic circuit diagram showing a configuration example of part of the memory die MD.
Figure 21:
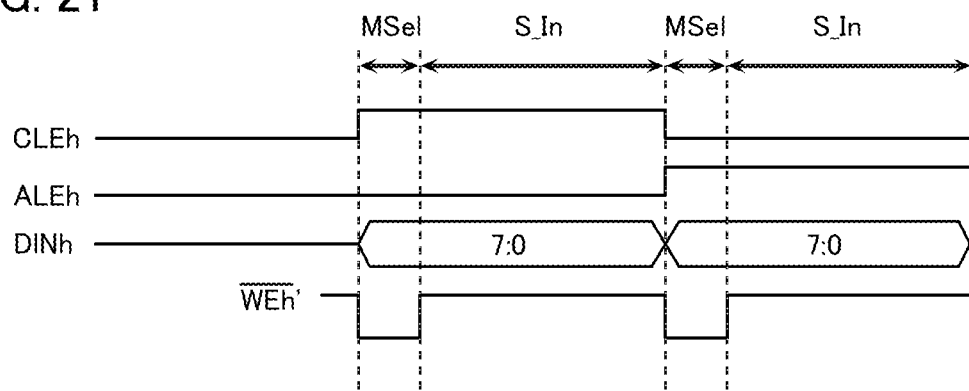
FIG. 21 is a schematic waveform diagram for explaining an operating method of the memory die MD.
Figure 22:
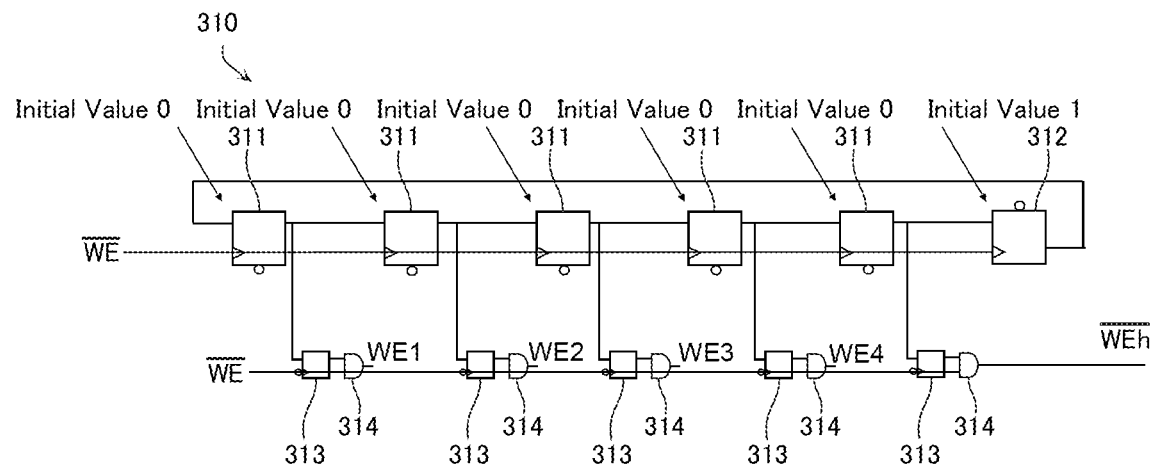
FIG. 22 is a schematic circuit diagram showing a configuration example of part of the memory die MD.
Figure 23:
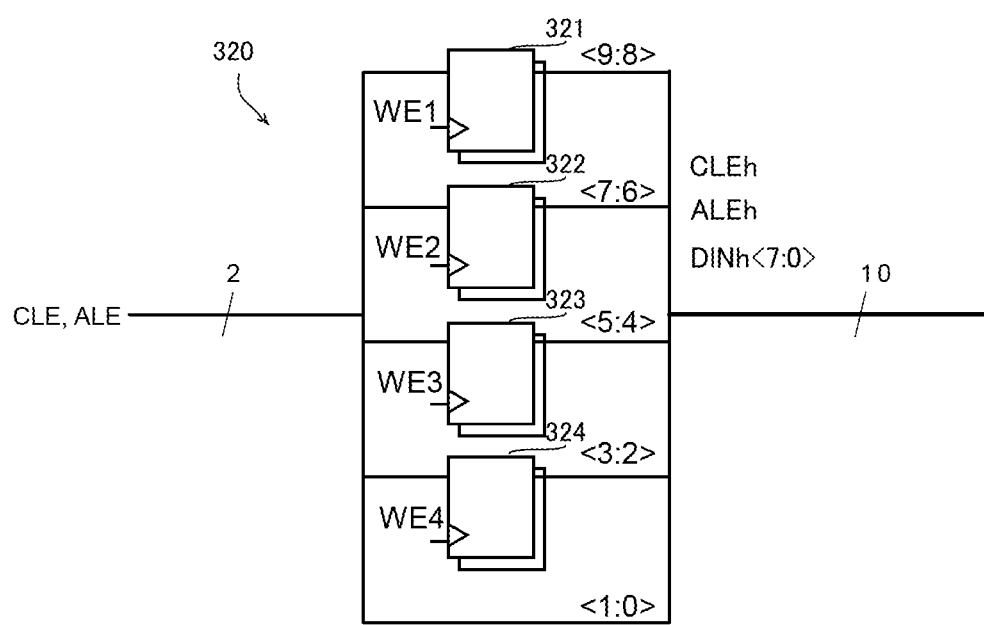
FIG. 23 is a schematic circuit diagram showing a configuration example of part of the memory die MD.

In the memory die MD according to the first embodiment, functions of the data signal input/output terminals DQ<7:0>, the external control terminals CLE, ALE, and so on, change according to which of operating modes MODEa, MODEb is selected. Such functions may be realized by circuits of the kinds shown in FIGS. 20, 22, and 23, for example. FIGS. 20, 22, and 23 are schematic circuit diagrams showing configuration examples of parts of the memory die MD. FIG. 21 is a schematic waveform diagram for explaining an operating method of the circuit shown in FIG. 20.

FIG. 20 illustrates: the data signal input/output terminals DQ<7:0>; the external control terminals CLE, ALE, /WE; and a circuit unit 200 connected to these data signal input/output terminals DQ<7:0> and external control terminals CLE, ALE, /WE.

The circuit unit 200 includes a latch circuit 210, multiplexers 220, 230, and a deserializer 300, for example.

The latch circuit 210 is a latch circuit included in the command register CMR or address register ADR. In FIG. 20, a latch circuit 210 corresponding to command data "05h" is exemplified as the latch circuit 210. In the example illustrated, the latch circuit 210 stores 1-bit data correspondingly to inputted command data Cmd. The latch circuit 210 has its data input terminal connected to output terminals DINh<7:0>, CLEh, ALEh of the multiplexer 220 via a logic circuit, and has its clock input terminal connected to an output terminal /WEh' of the multiplexer 230.

Select control terminals of each of the multiplexers 220, 230 are inputted with a select signal SerialCA. The select signal SerialCA will be in a "0" state when operating mode MODEa is selected, and will be in a "1" state when operating mode MODEb is selected.

The multiplexer 220 comprises the 10 output terminals DINh<7:0>, CLEh, ALEh. Of these 10 output terminals, the eight output terminals DINh<7:0> correspond to data configuring command data Cmd or address data Add. Moreover, the remaining two output terminals CLEh, ALEh correspond to input signals of the external control terminals CLE, ALE.

In addition, the multiplexer 220 comprises: 10 input terminals selected when the select signal SerialCA is in a "0" state; and 10 input terminals selected when the select signal SerialCA is in a "1" state. Eight of the 10 input terminals corresponding to a "0" state are connected to the data signal input/output terminals DQ<7:0>. The remaining two are connected to the external control terminals CLE, ALE. The 10 input terminals corresponding to a "1" state are connected to output terminals of the deserializer 300.

The multiplexer 230 comprises the one output terminal /WEh'. In addition, the multiplexer 230 comprises: one input terminal /WEh selected when the select signal SerialCA is in a "1" state; and one input terminal selected when the select signal SerialCA is in a "0" state. The input terminal /WEh corresponding to a "1" state is connected to an output terminal of the deserializer 300. The input terminal corresponding to a "0" state is connected to the external control terminal /WE.

The deserializer 300 comprises 10 output terminals connected to the multiplexer 220. The deserializer 300 converts to 8-bit data that has been inputted two bits at a time over four cycles from the external control terminals CLE, ALE, adds two bits of data indicating whether this 8-bit data is command data Cmd or is address data Add, and thereby generates 10-bit data. Moreover, the deserializer 300 outputs this 10-bit data to the multiplexer 220 via the 10 output terminals. This 10-bit data may be switched at a timing of start of period MSel, for example.

In addition, the deserializer 300 comprises one output terminal connected to the multiplexer 230. The deserializer 300 outputs "L" to the input terminal /WEh of the multiplexer 230 during a period from when a first cycle of data, of five cycles of data inputted from the external control terminal /WE, is inputted until the second cycle of data of those five cycles of data is inputted (during period MSel). Moreover, in a period other than this period (during period S_In), the deserializer 300 outputs "H" to the input terminal /WEh of the multiplexer 230.

In operating mode MODEa, 8-bit data that has been inputted via the data signal input/output terminals DQ<7:0> is inputted to the logic circuit via the output terminals DINh<7:0> of the multiplexer 220. Moreover, enable signals that have been inputted via the external control terminals CLE, ALE are inputted to the logic circuit via the output terminals CLEh, ALEh of the multiplexer 220. In the example illustrated, in the case that the 8-bit data that has been inputted via the data signal input/output terminals DQ<7:0> is command data "05h" and the input signals of the external control terminals CLE, ALE are "H, L", the output signal of the logic circuit will be "H". In other cases, the output signal of the logic circuit will be "L".

Moreover, in operating mode MODEa, a signal that has been inputted from the external control terminal /WE is outputted from the output terminal /WEh' of the multiplexer 230, and inputted to the clock input terminal of the latch circuit 210.

In operating mode MODEb, four cycles of two-bit data that have been inputted via the external control terminals CLE, ALE and an enable signal that has been inputted via the external control terminal /WE are converted to an 8-bit data signal and enable signals by the deserializer 300 and inputted to the input terminals of the multiplexer 220. These data and signals are inputted to the logic circuit via the output terminals DINh<7:0>, CLEh, ALEh of the multiplexer 220. In the example illustrated, in the case that "H, L" have been inputted from the external control terminals CLE, ALE in the period MSel and command data "05h" has been inputted from the external control terminals CLE, ALE in the period S_In, the output signal of the logic circuit will be "H". In other cases, the output signal of the logic circuit will be "L".

Moreover, in operating mode MODEb, a signal that has been inputted to the input terminal /WEh of the multiplexer 230 is outputted from the output terminal /WEh' of the multiplexer 230, and inputted to the clock input terminal of the latch circuit 210.

FIGS. 22 and 23 are schematic circuit diagrams showing parts of the deserializer 300. The deserializer 300 includes: a circuit unit 310 of the kind shown in FIG. 22; and a circuit unit 320 of the kind shown in FIG. 23.

The circuit unit 310 comprises: five D flip-flops 311; and one D latch circuit 312. An output terminal of the first D flip-flop 311 is connected to a data input terminal of the second D flip-flop 311. Similarly, output terminals of the second through fourth D flip-flops 311 are connected to data input terminals of the third through fifth D flip-flops 311. An output terminal of the fifth D flip-flop 311 is connected to a data input terminal of the D latch circuit 312. An output terminal of the D latch circuit 312 is connected to a data input terminal of the first D flip-flop 311. Moreover, clock input terminals of these five D flip-flops 311 and one D latch circuit 312 are connected to the external control terminal /WE.

In addition, the circuit unit 310 comprises: five D latch circuits 313; and five AND circuits 314. Data input terminals of the five D latch circuits 313 are respectively connected to the output terminals of the five D flip-flops 311. Moreover, clock input terminals of the five D latch circuits 313 are inputted with an inverted signal of the external control terminal /WE. Ones of pairs of input terminals of the five AND circuits 314 are respectively connected to output terminals of the five D latch circuits 313. The others of pairs of input terminals of the five AND circuits 314 are each connected to the external control terminal /WE. Note that in the example of FIG. 22, output terminals of four of these five AND circuits 314 are indicated as output terminals WE1-WE4. The remaining one output terminal is connected to the input terminal /WEh of the above-described multiplexer 230 (FIG. 20).

Now, initial values of data stored in the five D flip-flops 311 are assumed to be 0, and an initial value of data stored in the D latch circuit 312 is assumed to be 1. In such a case, if the external control terminal /WE is inputted with "L" and "H" at substantially a constant pace, then due to a first cycle of input of the external control terminal /WE, a signal of the output terminal WE1 will attain an "H" state, and signals of the output terminals WE2, WE3, WE4 will attain an "L" state. Moreover, due to a second cycle of input, the signal of the output terminal WE2 will attain an "H" state, and the signals of the output terminals WE1, WE3, WE4 will attain an "L" state. Moreover, due to a third cycle of input, the signal of the output terminal WE3 will attain an "H" state, and the signals of the output terminals WE1, WE2, WE4 will attain an "L" state. Moreover, due to a fourth cycle of input, the signal of the output terminal WE4 will attain an "H" state, and the signals of the output terminals WE1, WE2, WE3 will attain an "L" state.

The circuit unit 320 comprises two each of D latch circuits 321-324. Data input terminals of ones of these twos of D latch circuits 321-324 are connected to the external control terminal CLE. Data input terminals of the others of these twos of D latch circuits 321-324 are connected to the external control terminal ALE. Moreover, clock input terminals of the two D latch circuits 321 are connected to the output terminal WE1 of the AND circuit 314. Similarly, clock input terminals of the D latch circuits 322, 323, 324 are respectively connected to the output terminals WE2, WE3, WE4 of the AND circuit 314.

A first cycle of data of the external control terminals CLE, ALE is stored in the two D latch circuits 321. A second cycle of data of the external control terminals CLE, ALE is stored in the two D latch circuits 322. A third cycle of data of the external control terminals CLE, ALE is stored in the two D latch circuits 323. A fourth cycle of data of the external control terminals CLE, ALE is stored in the two D latch circuits 324.

Second Embodiment

Figure 24:
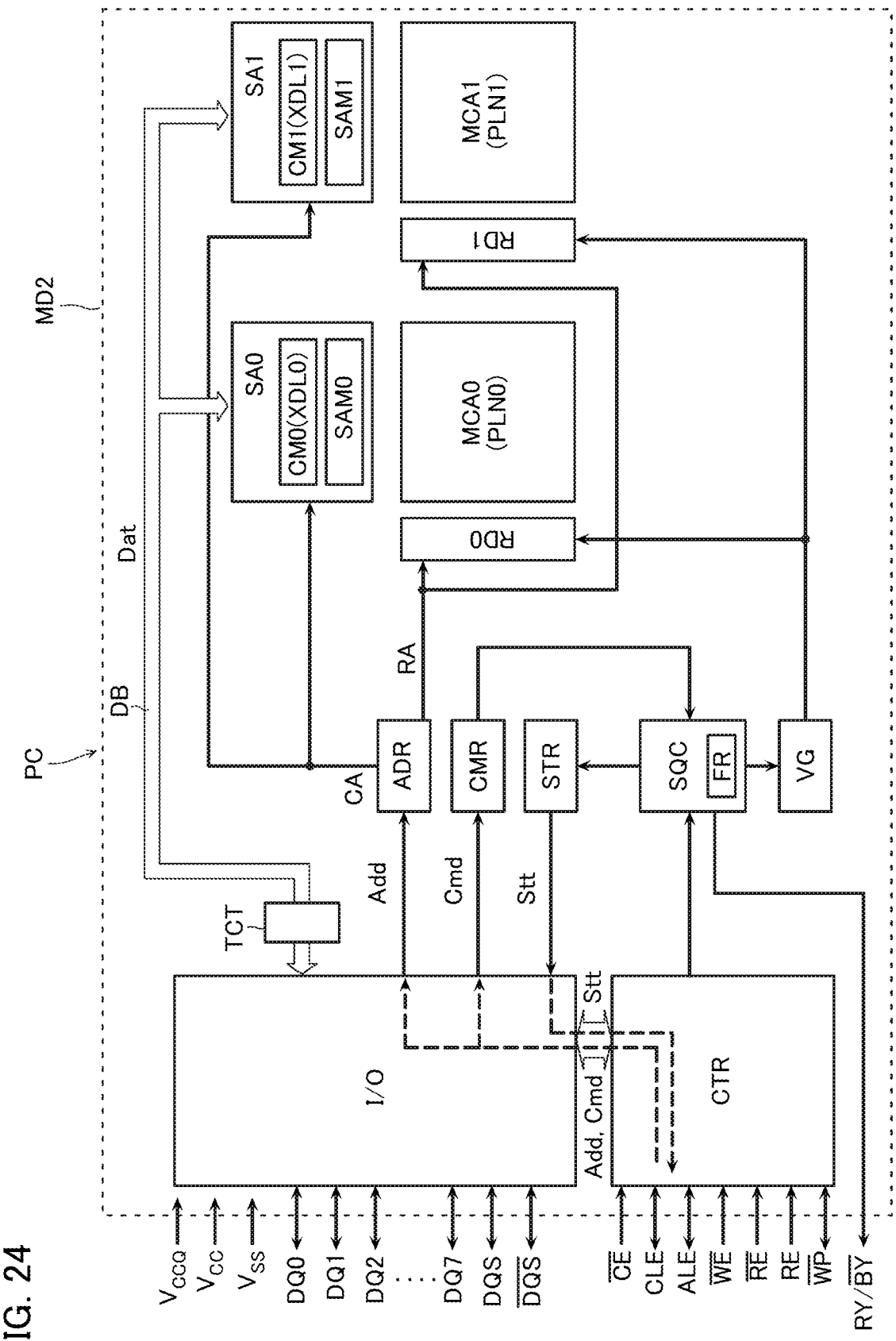
FIG. 24 is a schematic block diagram showing a configuration of a memory die MD2 according to a second embodiment.

Next, a semiconductor memory device according to a second embodiment will be described with reference to FIGS. 24 and 25. FIG. 24 is a schematic block diagram showing a configuration of a memory die MD2 according to the second embodiment. FIG. 25 is a schematic circuit diagram showing a configuration of part of the memory die MD2. For convenience of description, some configurations are omitted in FIGS. 24 and 25.

As shown in FIGS. 24 and 25, the semiconductor memory device according to the present embodiment is basically configured similarly to the semiconductor memory device according to the first embodiment. However, the semiconductor memory device according to the second embodiment is capable of outputting status data Stt via the external control terminals CLE, ALE. As shown in FIG. 25, the external control terminals CLE, ALE according to the second embodiment are connected to the input circuit 201 and the output circuit 202.

In addition, the semiconductor memory device according to the present embodiment is capable of being operated in operating mode MODEc, as well as in operating mode MODEa and operating mode MODEb.

Figures 26, 27, 28:
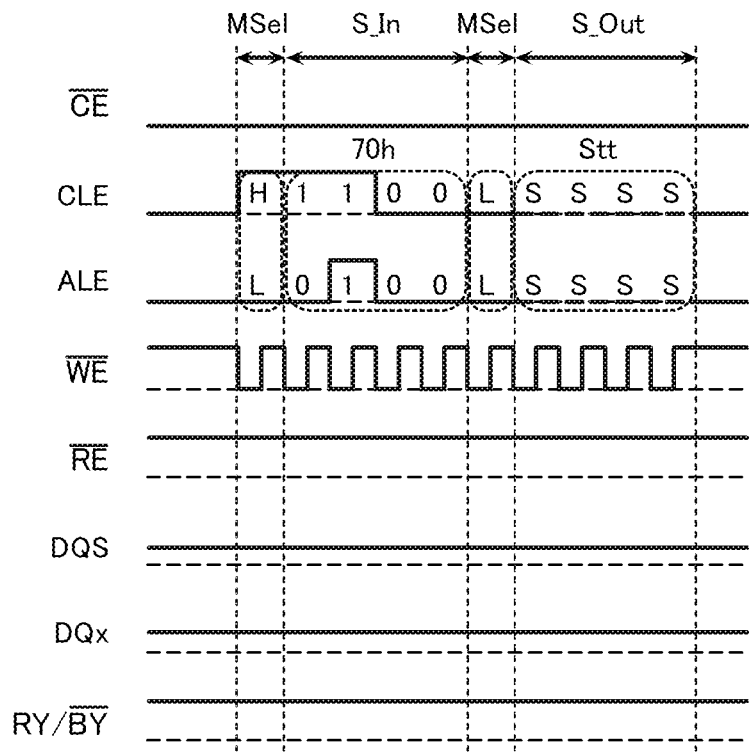
FIG. 26 is a truth table for explaining operating mode MODEc.
FIG. 27 is a truth table for explaining operating mode MODEc.
FIG. 28 is a schematic waveform diagram for explaining operation of the memory die MD2.

FIGS. 26 and 27 are truth tables for explaining roles of the external terminals in operating mode MODEc. FIG. 26 shows roles of the external control terminals in period MSel. FIG. 27 shows roles of the external control terminals in periods S_In, S_Out.

Operation of the memory die MD2 in operating mode MODEc is basically similar to operation of the memory die MD in operating mode MODEb.

However, in operating mode MODEc, not only can address data Add and command data Cmd be inputted via the external control terminals CLE, ALE, but it is also possible for status data Stt to be outputted via the external control terminals CLE, ALE.

As shown in FIG. 26, in period MSelin the period MSel of operating mode MODEc, when an input/output data select signal to the effect that status data Stt is to be outputted is inputted, the controller die CD raises the external control terminal /WE from "L" to "H" in a state where the external control terminal CLE has been inputted with "L", and the external control terminal ALE has been inputted with "L", for example.

Moreover, as shown in FIG. 27, in period S_Out of operating mode MODEc, when status data Stt is outputted, the controller die CD lowers an input signal of the external control terminal /WE, for example. As a result, two bits of the status data Stt are outputted from the external control terminals CLE, ALE to the controller die CD by the output circuit 202.

FIG. 28 is a schematic waveform diagram for explaining operation of the memory die MD2 according to the second embodiment. FIG. 28 shows waveforms when command data Cmd and address data Add are inputted in operating mode MODEc.

In the example of FIG. 28, the external control terminal /WE is inputted with "L" and "H" at substantially a constant pace. Moreover, a period from when, at a certain timing, an input signal of the external control terminal /WE once falls until when it once again falls is indicated as the above-mentioned period MSel. Moreover, a period from when the input signal of the external control terminal /WE falls upon completion of the period MSel until when the input signal of the external control terminal /WE has fallen four times is indicated as the period S_In or period S_Out.

In operating mode MODEc, when, in the period MSel, the controller die CD has inputted the memory die MD2 with an input/output data select signal specifying input of command data Cmd or address data Add, a period immediately thereafter will be period S_In. On the other hand, when, in the period MSel, the controller die CD has inputted the memory die MD2 with an input/output data select signal to the effect that status data Stt is to be outputted, a period immediately thereafter will be period S_Out.

Status data Stt outputted in the period S_Out may be 8-bit data similar to the status data Stt outputted when the status-read is executed in operating mode MODEa or operating mode MODEb, for example. In such a case, the status data Stt may be outputted two bits at a time divided into four cycles.

Figure 29:
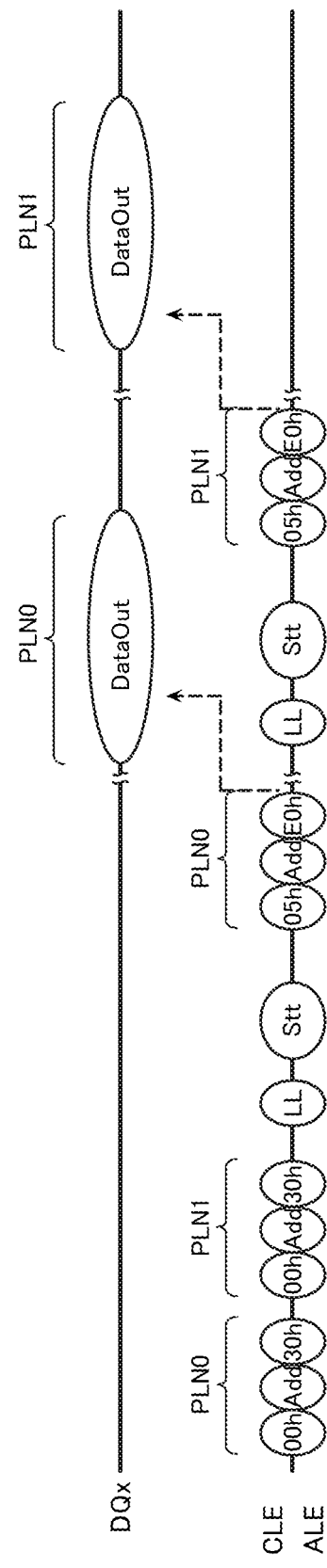
FIG. 29 is a schematic waveform diagram for explaining operation of the memory die MD2.

FIG. 29 is a schematic timing chart showing a situation when the read operation and the data-out operation are executed in operating mode MODEc. In the example of FIG. 29, the memory die MD2 is set to operating mode MODEc.

Operation exemplified in FIG. 29 is basically similar to operation described with reference to FIG. 19. However, in the example of FIG. 29, the external control terminals CLE, ALE are inputted with "L, L" during execution of the status-read. Moreover, the status data Stt is outputted from the external control terminals CLE, ALE, not the data signal input/output terminals DQ<7:0>. Moreover, while the data-out operation on the plane PLN0 is being performed, the status-read and output of the status data Stt are performed, and, furthermore, input of a command set to the effect that the data-out operation on the plane PLN1 is to be executed, is started.

Note that the output circuits 202 (FIG. 25) connected to the external control terminals CLE, ALE are driven in operating mode MODEc. These output circuits 202 need not be driven in operating modes MODEa, MODEb.

[Circuit Applicable to Memory Die MD2 in Second Embodiment]

Figure 30:
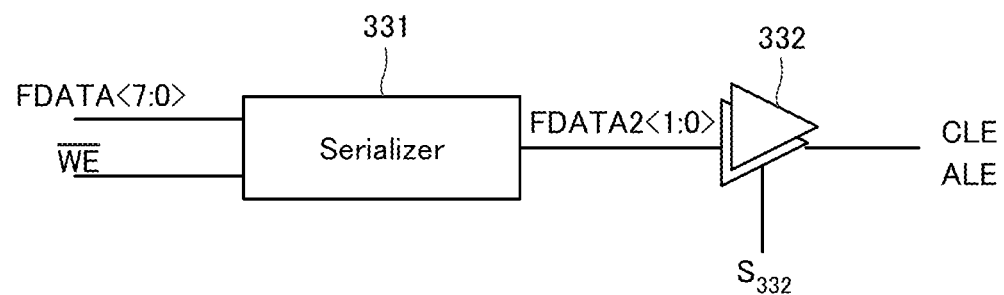
FIG. 30 is a schematic circuit diagram showing a configuration example of part of the memory die MD2.

In the memory die MD2 according to the second embodiment, when operating mode MODEc has been selected, 8-bit status data Stt is outputted converted into four cycles of 2-bit data. Such a function may be realized by a circuit of the kind shown in FIG. 30, for example. FIG. 30 is a schematic circuit diagram showing a configuration example of part of the memory die MD2.

The circuit shown in FIG. 30 comprises: a serializer 331; and two switch circuits 332.

The serializer 331 comprises: eight first input terminals; and one second input terminal. The first input terminals are each inputted with one bit of 8-bit data FDATA<7:0> configuring the 8-bit status data Stt. The second input terminal is connected to the external control terminal /WE. The serializer 331 converts the 8-bit data FDATA<7:0> into 2-bit data FDATA2<1:0> and sequentially outputs the converted data over four cycles, in response to input signals of the external control terminal /WE.

The two switch circuits 332 are respectively provided correspondingly to the external control terminals CLE, ALE. Output terminals of the switch circuits 332 are connected to the external control terminal CLE or the external control terminal ALE. Input terminals of the switch circuits 332 are connected to an output terminal of the serializer 331. The switch circuit 332 outputs an input signal in response to input of agate signal $S_{332}$. The gate signal $S_{332}$ may be in an "H" state when, for example, the external control terminal /WE is in an "L" state, it is the first cycle of period S_Out (FIG. 28), the external control terminals CLE, ALE are inputted with "L, L" in period MSel, operating mode MODEc is selected, and the memory die MD2 is selected.

Third Embodiment

Figure 31:
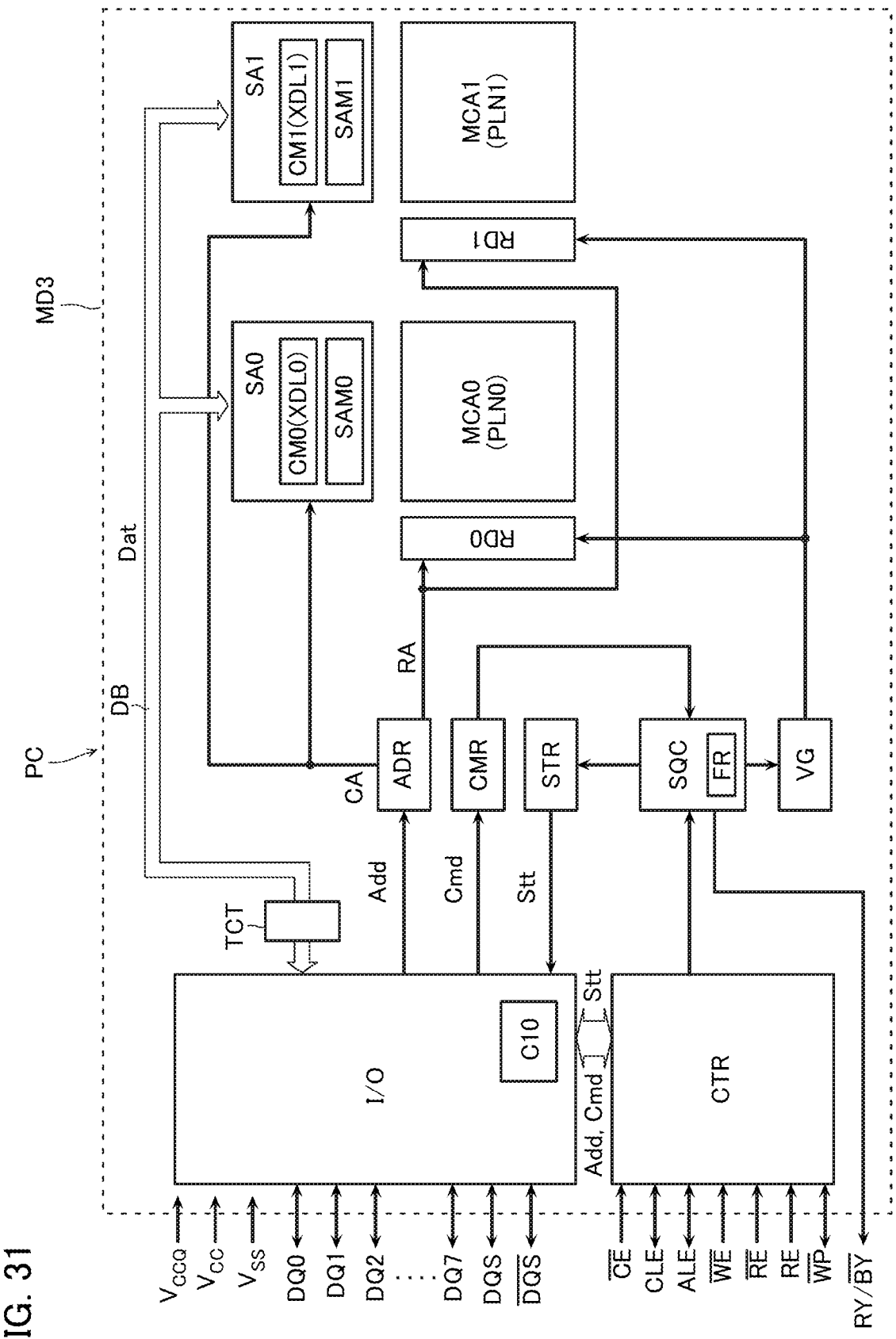
FIG. 31 is a schematic block diagram showing a configuration of a memory die MD3 according to a third embodiment.

Next, a semiconductor memory device according to a third embodiment will be described with reference to FIG. 31. FIG. 31 is a schematic block diagram showing a configuration of a memory die MD3 according to the third embodiment. For convenience of description, some configurations are omitted in FIG. 31.

As shown in FIG. 31, the semiconductor memory device according to the present embodiment is basically configured similarly to the semiconductor memory device according to the second embodiment. However, as shown in FIG. 31, the input/output control circuit I/O according to the present embodiment comprises a compression-decompression circuit C10. The compression-decompression circuit C10 extracts required information from status data Stt in the status register STR, and outputs the extracted information.

In the third embodiment, status data Stt outputted in period S_Out of operating mode MODEc differs from status data Stt outputted when the status-read has been executed in operating mode MODEa or operating mode MODEb.

Figure 32:
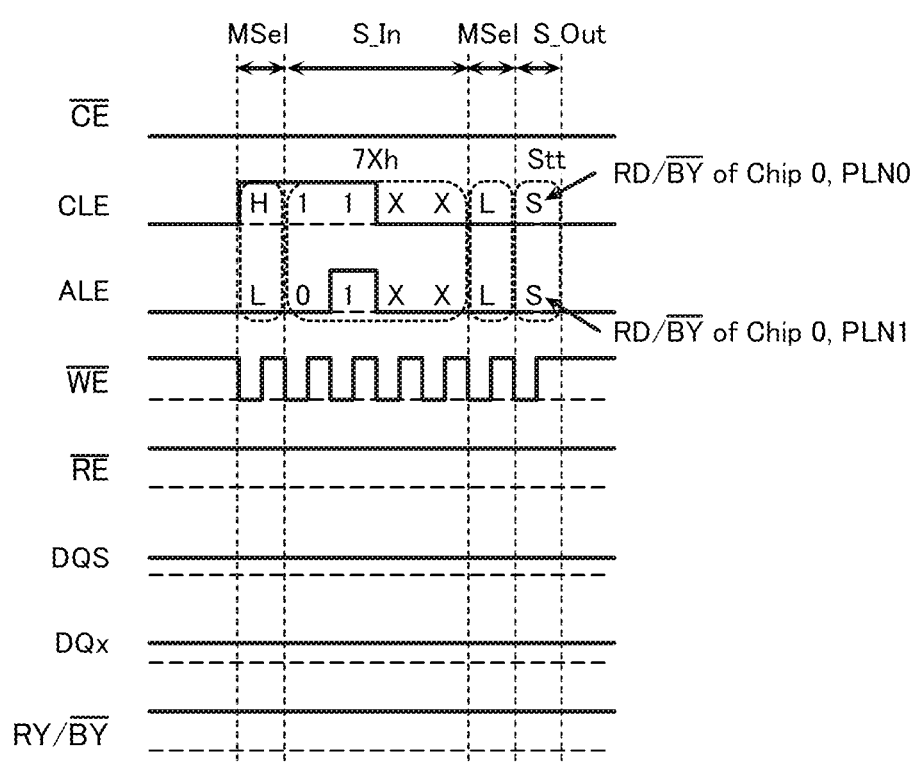
FIG. 32 is a schematic waveform diagram for explaining operation of the memory die MD3.

For example, in the present embodiment, status data Stt outputted during period S_Out may be 2-bit data indicating ready/busy states of the two planes PLN0, PLN1 included in a selected memory die MD3, as shown in FIG. 32, for example. Moreover, when, for example, the memory die MD3 includes four or more planes PLN, the status data Stt may be multiple-bit data indicating ready/busy states of the plurality of planes PLN included in the memory die MD3. In such a case, the status data Stt may be outputted two bits at a time divided into multiple cycles.

Moreover, in the present embodiment, status data Stt outputted during period S_Out may be multiple-bit data indicating ready/busy states of all of the memory dies MD3 controlled by the controller die CD, for example. When, as exemplified in FIGS. 2 and 3, for example, the pluralities of pad electrodes P of eight memory dies MD3 are respectively connected to each other via bonding wires B and the eight memory dies MD3 are controlled by the controller die CD, the status data Stt may be 8-bit data indicating the ready/busy states of these eight memory dies MD3, for example. In such a case, the status data Stt of each of the memory dies MD3 may be outputted two bits at a time divided into four cycles in an order depending on chip address. More specifically, for example, in the first cycle, the first memory die MD3 outputs its ready/busy state from the external control terminal CLE, and the second memory die MD3 outputs its ready/busy state from the external control terminal ALE. Similarly, in the second cycle, the third memory die MD3 outputs its ready/busy state from the external control terminal CLE, and the fourth memory die MD3 outputs its ready/busy state from the external control terminal ALE. In the third cycle, the fifth memory die MD3 outputs its ready/busy state from the external control terminal CLE, and the sixth memory die MD3 outputs its ready/busy state from the external control terminal ALE. In the fourth cycle, the seventh memory die MD3 outputs its ready/busy state from the external control terminal CLE, and the eighth memory die MD3 outputs its ready/busy state from the external control terminal ALE. Moreover, in this case, the memory dies MD3 are each set to a state where their external control terminal ALE or CLE not outputting status data Stt does not accept a signal from outside.

Fourth Embodiment

Figure 33:
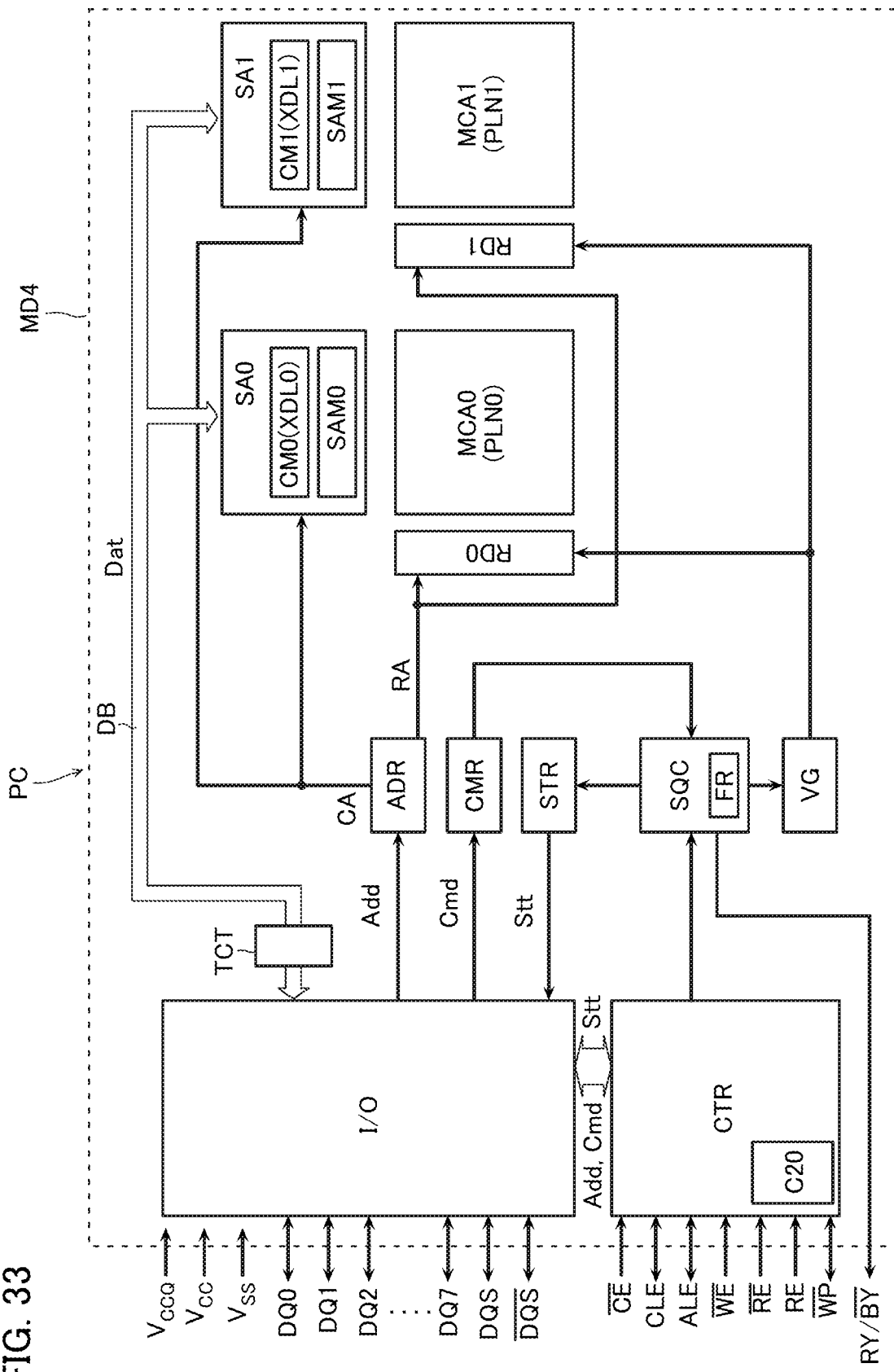
FIG. 33 is a schematic block diagram showing a configuration of a memory die MD4 according to a fourth embodiment.
Figures 34, 35:
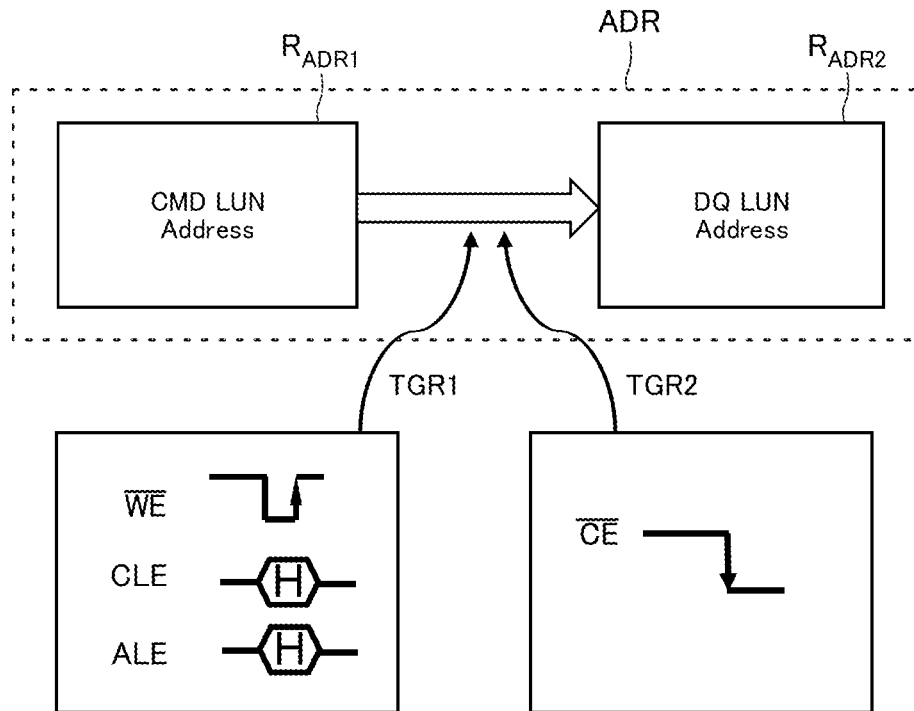
FIG. 34 is a schematic block diagram showing a configuration of the memory die MD4.
FIG. 35 is a truth table for explaining operating mode MODEd.

Next, a semiconductor memory device according to a fourth embodiment will be described with reference to FIGS. 33 and 34. FIGS. 33 and 34 are schematic block diagrams showing configurations of a memory die MD4 according to the fourth embodiment. For convenience of description, some configurations are omitted in FIGS. 33 and 34.

As shown in FIG. 33, the semiconductor memory device according to the present embodiment is basically configured similarly to the semiconductor memory device according to any of the first through third embodiments.

However, as shown in FIG. 33, the logic circuit CTR according to the fourth embodiment comprises an internal address switching circuit C20. As shown in FIG. 34, for example, the internal address switching circuit C20 transfers address data Add stored in a region $R_{ADR1}$ in the address register ADR to a region $R_{ADR2}$ in the address register ADR, in accordance with input of a trigger signal TGR1 or a trigger signal TGR2. Note that the region $R_{ADR2}$ may be a region storing address data Add corresponding to data inputted/outputted via the data signal input/output terminals DQ<7:0>, for example. Moreover, the region $R_{ADR1}$ may be a region storing address data Add corresponding to data inputted/outputted via the external control terminals CLE, ALE, for example.

Moreover, the semiconductor memory device according to the present embodiment is capable of being operated in operating mode MODEd, as well as in operating modes MODEa, MODEb, MODEc.

Sometimes, for example, pluralities of the pad electrodes P of the plurality of memory dies MD are respectively connected to each other via the bonding wires B, as shown in FIGS. 2 and 3. Sometimes, for example, during execution of the data-out operation on one of a plurality of the memory dies MD4 whose pad electrodes P have been connected to each other in this way, input of the command set to another memory die MD4 is performed. In such a case, if address data is reflected at a timing when input of the command data has ended, there is a risk that the address data will be switched during execution of the data-out operation, and that it will be impossible for the user data Dat to be suitably outputted.

Accordingly, in the semiconductor memory device according to the fourth embodiment, the controller die CD detects completion of the data-out operation, and inputs the memory die MD4 with the above-described trigger signals TGR1, TGR2.

FIG. 35 is a truth table for explaining roles of the external terminals in operating mode MODEd. FIG. 35 shows roles of the external control terminals in period MSel.

Operation of the memory die MD4 in operating mode MODEd is basically similar to the operation of the memory dies MD2, MD3 in operating mode MODEc.

However, in operating mode MODEd, it is possible for the trigger signals TGR1, TGR2 to be inputted in period MSel.

When the trigger signal TGR1 is inputted, the controller die CD raises the external control terminal /WE from "L" to "H" in a state where the external control terminals CLE, ALE have been inputted with "H", for example.

When the trigger signal TGR2 is inputted, the controller die CD lowers the external control terminal /CE from "H" to "L" in a state where the external control terminal /WE has been inputted with "H", for example.

Figure 36:
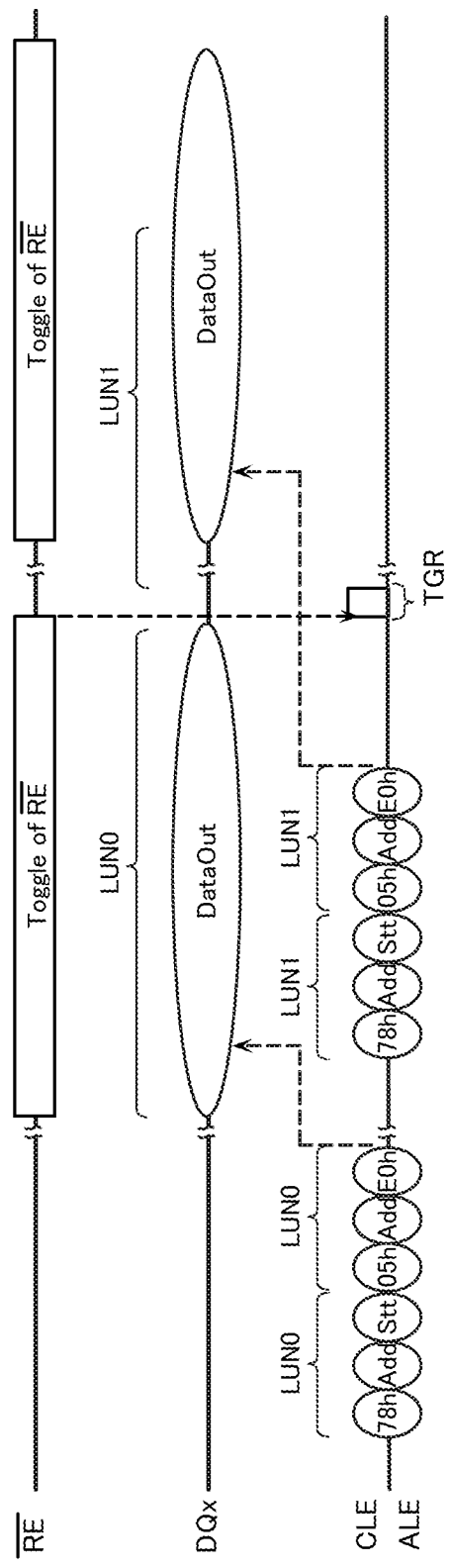
FIG. 36 is a schematic waveform diagram for explaining operation of the memory die MD4.
Figure 37:
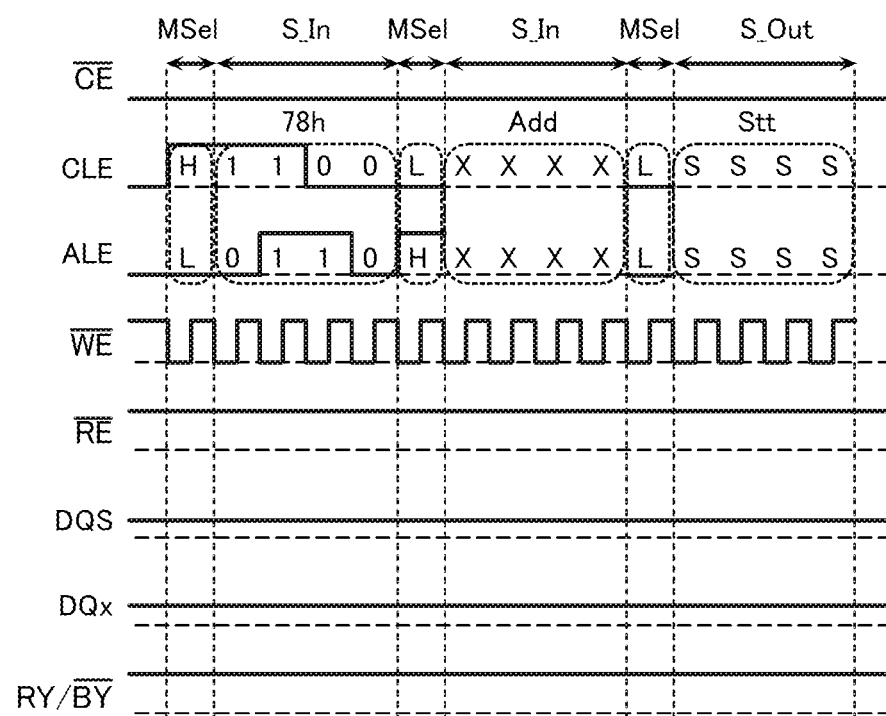
FIG. 37 is a schematic waveform diagram for explaining operation of the memory die MD4.

FIGS. 36 and 37 are schematic timing charts showing situations when the data-out operation is executed in operating mode MODEd. In the examples of FIGS. 36 and 37, the memory die MD4 is set to operating mode MODEd.

In the examples of FIGS. 36 and 37, first, command data "78h" and address data Add are inputted via the external control terminals CLE, ALE. The command data "78h" is command data instructing the status-read. The address data Add included in this command set includes information of a memory die MD4 (LUN0) to be targeted for the data-out operation, as the above-described chip address. Due to input of the command data "78h", the status-read is performed, and status data Stt is outputted via the external control terminals CLE, ALE.

Next, command data "05h", address data Add, and command data "E0h" are sequentially inputted via the external control terminals CLE, ALE. This address data Add includes information of the memory die MD4 (LUN0) to be targeted for the data-out operation, as the above-described chip address.

After a certain standby time, the controller die CD switches (toggles) input signals of the external control terminals/RE, RE. As a result, the data-out operation is started on the memory die MD4 (LUN0), and user data "DataOut" is outputted via the data signal input/output terminals DQ<7:0>.

Moreover, in the example of FIG. 36, while the data-out operation on the memory die MD4 (LUN0) is being performed, command data "78h" and address data Add are inputted via the external control terminals CLE, ALE. This address data Add includes information of a memory die MD4 (LUN1) to be targeted for the data-out operation, as the above-described chip address. Due to input of the command data "78h", the status-read is performed, and status data Stt is outputted via the external control terminals CLE, ALE.

Next, command data "05h", address data Add, and command data "E0h" are sequentially inputted via the external control terminals CLE, ALE. This address data Add includes the likes of an address of the memory die MD4 (LUN1) to be targeted for the data-out operation, as the above-described chip address. Input of these data is also performed while the data-out operation on the memory die MD4 (LUN0) is being performed, that is, in a period when the controller die CD switches (toggles) the input signals of the external control terminals/RE, RE. Now, in the case where the pluralities of pad electrodes P of the memory die MD4 (LUN0) and the memory die MD4 (LUN1) are respectively connected to each other via the bonding wires B as described above, the external control terminals/RE, RE too are respectively connected. Hence, if the input signals of the external control terminals/RE, RE of the memory die MD4 (LUN0) are switched (toggled) while the data-out operation on the memory die MD4 (LUN0) is being performed, it will result in the input signals of the external control terminals/RE, RE of the memory die MD4 (LUN1) also being switched (toggled) while the data-out operation on the memory die MD4 (LUN0) is being performed. However, as shown in FIG. 34, the internal address switching circuit C20 of the logic circuit CTR according to the fourth embodiment will not transfer address data Add stored in the region $R_{ADR1}$ in the address register ADR to the region $R_{ADR2}$ in the address register ADR unless the trigger signal TGR1 or the trigger signal TGR2 is inputted. Hence, even after the memory die MD4 (LUN1) has been sequentially inputted with command data "05h", address data Add, and command data "E0h" via the external control terminals CLE, ALE, it will not output user data from the data signal input/output terminals DQ<7:

0> unless the trigger signal TGR1 or the trigger signal TGR2 is inputted, even if the input signals of the external control terminals /RE, RE are switched (toggled). Hence, it can be avoided that user data is simultaneously outputted from the data signal input/output terminals DQ<7:0> of the memory die MD4 (LUN0) and the data signal input/output terminals DQ<7:0> of the memory die MD4 (LUN1).

Next, after completion of the data-out operation on the memory die MD4 (LUN0), either of the above-described trigger signals TGR1, TGR2 is inputted. Then, the controller die CD switches (toggles) the input signals of the external control terminals /RE, RE. As a result, the data-out operation is started on the memory die MD4 (LUN1), and user data "DataOut" is outputted via the data signal input/output terminals DQ<7:0>.

Figure 38:
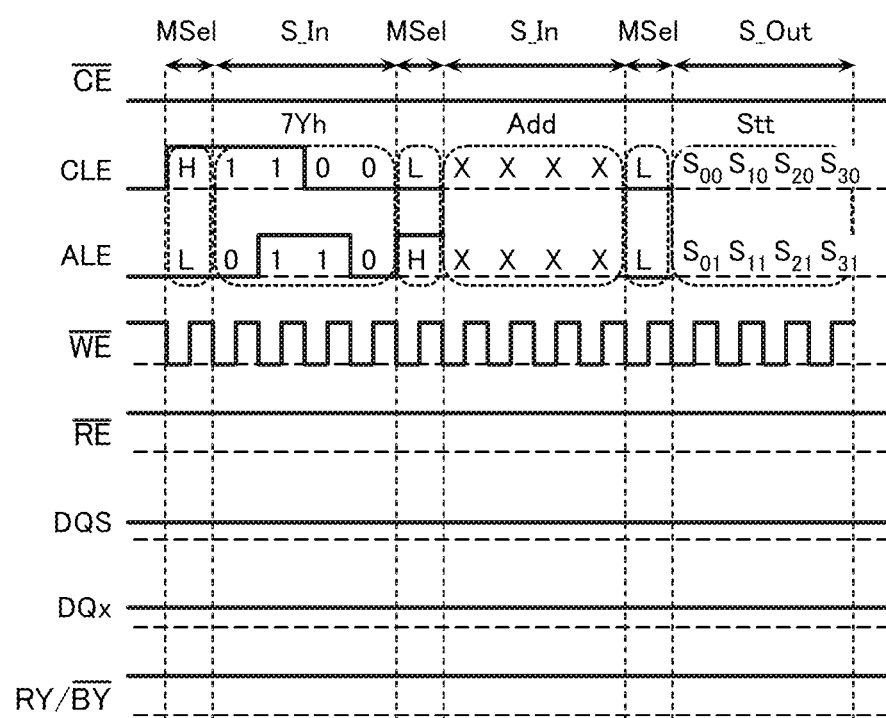
FIG. 38 is a schematic waveform diagram for explaining operation of the memory die MD4.

Note that in the fourth embodiment, it is possible for the status-read to be executed by a variety of methods. For example, in the fourth embodiment, the status-read may be executed by similar methods to in the memory dies according to any of the first through third embodiments. Moreover, in the fourth embodiment, data $S_{00}$, $S_{01}$, $S_{10}$, $S_{11}$, $S_{20}$, $S_{21}$, $S_{30}$, $S_{31}$ may be outputted by the status-read, as in FIG. 38. These data $S_{00}$, $S_{01}$, $S_{10}$, $S_{11}$, $S_{20}$, $S_{21}$, $S_{30}$, $S_{31}$ may respectively indicate a ready/busy state of the plane PLN0 of a first memory die MD4, a ready/busy state of the plane PLN1 of the first memory die MD4, a ready/busy state of the plane PLN0 of a second memory die MD4, a ready/busy state of the plane PLN1 of the second memory die MD4, a ready/busy state of the plane PLN0 of a third memory die MD4, a ready/busy state of the plane PLN1 of the third memory die MD4, a ready/busy state of the plane PLN0 of a fourth memory die MD4, and a ready/busy state of the plane PLN1 of the fourth memory die MD4.

Other Embodiments

That concludes description of the semiconductor memory devices according to the first through fourth embodiments. However, the above description is merely exemplary, and specific configurations, operations, and so on, may be appropriately adjusted.

Figure 39:
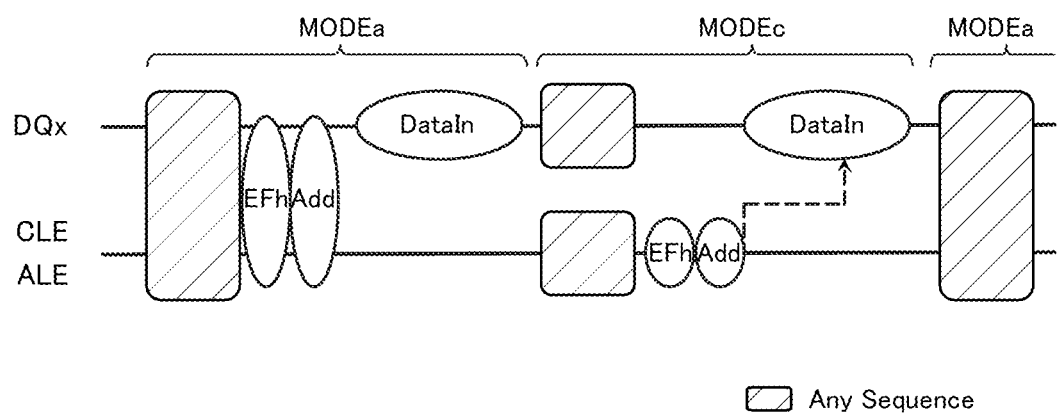
FIG. 39 is a schematic waveform diagram for explaining operation of a memory die according to another embodiment.

For example, it is possible too for the configurations, operations, and so on, described above to be used appropriately combined. For example, it is possible too for the memory die to be operated selecting operating mode MODEa, the memory die to be operated selecting operating mode MODEc, and the memory die to be further operated reselecting operating mode MODEa, and so on, as exemplified in FIG. 39. Moreover, a configuration may be adopted whereby, for example, the operating mode of the memory die is set to MODEa after power-on, and the operating mode is switched in response to acceptance of the command set, and so on.

Moreover, in the description above, in operating modes MODEb, MODEc, MODEd, input/output of 2-bit data utilizing the external control terminals CLE, ALE was performed. However, such a method is merely an exemplification, and a specific method may be appropriately adjusted. For example, in operating modes MODEb, MODEc, MODEd, another terminal (for example, the external control terminal /WP, and so on, described with reference to the likes of FIG. 4), or the like, may be utilized to perform input/output of 3 or more-bit data. Moreover, one or two terminals from among terminals including the external control terminals CLE, ALE may be selected to perform input/output of 1-bit or 2-bit data.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first pad configured to receive a first signal;
   a second pad configured to receive a second signal;
   a third pad configured to receive a third signal;
   a first memory cell array comprising a plurality of first memory strings, the plurality of first memory strings each comprising a plurality of first memory cell transistors;
   a first sense amplifier connected to the first memory cell array;
   a first data register connected to the first sense amplifier and configured to store data read from the first memory cell array; and
   a control circuit configured to execute an operation targeting the first memory cell array, wherein
   the first pad is provided in plurality,
   in a first mode, a command set instructing the operation is inputted via the first pads, and
   in a second mode, the command set is inputted via the second pad and the third pad.

2. The semiconductor memory device according to claim 1, wherein
   the command set includes command data and address data, and
   in the first mode,
      when the second signal inputted to the second pad is at a first level, and
      the third signal inputted to the third pad is at a second level different from the first level,
         the first signal inputted to the first pads is accepted as the command data, and
      when the second signal inputted to the second pad is at the second level, and
      the third signal inputted to the third pad is at the first level,
         the first signal inputted to the first pads is accepted as the address data.

3. The semiconductor memory device according to claim 1, further comprising
   a fourth pad configured to receive a fourth signal,
   wherein in the first mode, the command set is inputted via the first pads in synchronization with the fourth signal, and
   in the second mode, the command set is inputted via the second pad in synchronization with the fourth signal.

4. The semiconductor memory device according to claim 1, further comprising:
   a first receiver and a first driver connected to the first pads; and
   a second receiver and a second driver connected to the second pad, wherein in the first mode, the first receiver, the first driver, and the second receiver are driven, but the second driver is not driven, and in the second mode, the first receiver, the first driver, the second receiver, and the second driver are driven.

5. The semiconductor memory device according to claim 1, further comprising:
a first receiver and a first driver connected to the first pads;
a second receiver and a second driver connected to the second pad; and
a third receiver and a third driver connected to the third pad, wherein
in the first mode, the first receiver, the first driver, the second receiver, and the third receiver are driven, but the second driver and the third driver are not driven, and
in the second mode, the first receiver, the first driver, the second receiver, the second driver, the third receiver, and the third driver are driven.

6. The semiconductor memory device according to claim 1, further comprising
a command register configured to store data inputted from the first pads and the second pad,
wherein the second pad is connected to the command register via a deserializer.

7. The semiconductor memory device according to claim 1, further comprising
a command register configured to store data inputted from the first pads, the second pad, and the third pad,
wherein the second pad and the third pad are connected to the command register via a deserializer.

8. The semiconductor memory device according to claim 1, wherein the semiconductor memory device
is set to the first mode after power-on, and
is set to the second mode in response to acceptance of the command set to instruct setting to the second mode.

9. The semiconductor memory device according to claim 1, wherein
the control circuit executes:
a read operation in which the data is read from the first memory cell array and stored in the first data register; and
a data-out operation in which the data stored in the first data register is outputted from the first pads.

10. The semiconductor memory device according to claim 1, further comprising:
a second memory cell array comprising a plurality of second memory strings, the plurality of second memory strings each comprising a plurality of second memory cell transistors;
a second sense amplifier connected to the second memory cell array; and
a second data register connected to the second sense amplifier and configured to store data read from the second memory cell array,
wherein in the second mode,
while the data stored in the first data register is being outputted from the first pads,
the command set to instruct output of the data stored in the second data register is acceptable.

11. The semiconductor memory device according to claim 1, further comprising:
a fifth pad configured to receive a fifth signal,
wherein in the second mode,
after the command set to instruct output of the data stored in the first data register has been accepted, and
after a trigger signal is accepted,
the data is outputted from the first pads in response to a toggling of the fifth signal inputted to the fifth pad, and
after the command set to instruct output of the data stored in the first data register has been accepted, and before the trigger signal is accepted,
the data is not outputted from the first pads, even when the fifth signal inputted to the fifth pad is toggled.

12. The semiconductor memory device according to claim 11, further comprising
a sixth pad configured to receive a sixth signal,
wherein in the second mode, the trigger signal is generated in response to a toggling of the sixth signal inputted to the sixth pad.

13. The semiconductor memory device according to claim 1, further comprising
a status register configured to store status data indicating an operating state of the first memory cell array,
wherein in the first mode, the status data is transmitted via the first pads, and
in a third mode, the status data is transmitted via the second pad.

14. A semiconductor memory device comprising:
a first pad configured to transmit a seventh signal;
a second pad configured to transmit an eighth signal;
a first memory cell array comprising a plurality of first memory strings, the plurality of first memory strings each comprising a plurality of first memory cell transistors;
a first sense amplifier connected to the first memory cell array;
a first data register connected to the first sense amplifier and configured to store data read from the first memory cell array;
a control circuit configured to execute an operation targeting the first memory cell array; and
a status register configured to hold status data indicating an operating state of the first memory cell array,
wherein in a first mode, the status data is transmitted via the first pad, and
in a third mode, the status data is transmitted via the second pad.

15. The semiconductor memory device according to claim 14, further comprising
a third pad configured to transmit a ninth signal,
wherein the first pad is provided in plurality,
in the first mode, the status data is transmitted via the first pads, and
in the third mode, the status data is transmitted via the second pad and the third pad.

16. The semiconductor memory device according to claim 15, wherein
the second pad is configured to receive a second signal,
the third pad is configured to receive a third signal, and
in the first mode,
when the second signal inputted to the second pad is at a first level, and
the third signal inputted to the third pad is at the first level,
the status data is outputted from the first pads as the seventh signal.

17. The semiconductor memory device according to claim 14, further comprising
a fourth pad configured to receive a fourth signal, wherein in the first mode, the status data is transmitted via the first pads in synchronization with the fourth signal, and in the third mode, the status data is transmitted via the second pad in synchronization with the fourth signal.

18. The semiconductor memory device according to claim 14, further comprising:
a first receiver and a first driver connected to the first pads; and
a second receiver and a second driver connected to the second pad,
wherein in the first mode, the first receiver, the first driver, and the second receiver are driven, but the second driver is not driven, and
in the third mode, the first receiver, the first driver, the second receiver, and the second driver are driven.

19. The semiconductor memory device according to claim 14, wherein
the second pad is connected to the status register via a serializer.

* * * * *